(12) United States Patent
Ito et al.

(10) Patent No.: US 8,328,473 B2
(45) Date of Patent: Dec. 11, 2012

(54) DRILL AND METHOD OF PRODUCING PRINTED CIRCUIT BOARD

(75) Inventors: Akinobu Ito, Ogaki (JP); Yasuharu Sakaguchi, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 1253 days.

(21) Appl. No.: 11/631,946

(22) PCT Filed: Jul. 5, 2005

(86) PCT No.: PCT/JP2005/012414
§ 371 (c)(1),
(2), (4) Date: Feb. 2, 2007

(87) PCT Pub. No.: WO2006/006451
PCT Pub. Date: Jan. 19, 2006

(65) Prior Publication Data
US 2007/0227766 A1    Oct. 4, 2007

(30) Foreign Application Priority Data

Jul. 9, 2004  (JP) .................. 2004-203718
May 31, 2005  (JP) .................. 2005-160137

(51) Int. Cl.
*B23B 27/14* (2006.01)
*B23B 51/02* (2006.01)

(52) U.S. Cl. ...................... 408/144; 408/230

(58) Field of Classification Search ................. 408/144, 408/230, 227, 229; *B23B 27/14, 51/02*
See application file for complete search history.

(56) References Cited

U.S. PATENT DOCUMENTS

| 4,826,365 | A | * | 5/1989 | White | 408/144 |
| 5,184,926 | A | * | 2/1993 | Hemmings | 408/226 |
| 5,230,593 | A | * | 7/1993 | Imanaga et al. | 408/230 |
| 5,584,617 | A | * | 12/1996 | Houser | 408/1 R |
| 6,652,203 | B1 | * | 11/2003 | Risen, Jr. | 408/225 |
| 2002/0141842 | A1 | * | 10/2002 | Tsuzaka et al. | 408/230 |
| 2003/0002941 | A1 | * | 1/2003 | Borschert et al. | 408/230 |
| 2003/0175086 | A1 | * | 9/2003 | Muhlfriedel et al. | 408/230 |
| 2003/0185640 | A1 | * | 10/2003 | Ito | 408/230 |
| 2004/0136798 | A1 |   | 7/2004 | Sasagawa et al. | |

FOREIGN PATENT DOCUMENTS

| DE | 3809356 A1 | * | 9/1989 |
| EP | 1 439 019 A1 | | 7/2004 |
| JP | 61-109609 U | | 7/1986 |
| JP | 63-62604 | | 3/1988 |
| JP | 01-146606 | | 6/1989 |
| JP | 06-210508 | | 8/1994 |
| JP | 7-24609 | | 1/1995 |
| JP | 07-024609 | | 1/1995 |
| JP | 08-090323 | | 4/1996 |

(Continued)

*Primary Examiner* — Eric A Gates
(74) *Attorney, Agent, or Firm* — Oblon, Spivak, McClelland, Maier & Neustadt, L.L.P.

(57) ABSTRACT

A drill in which no positional shift on a drilled hole and no irregularities on an internal wall are formed. A torsion angle of a shaving discharge groove of a drill is set in the range of 30 degrees to 50 degrees. In this manner, a positional shift of a through hole to be drilled can be reduced. In addition, shavings of the drill are properly discharged, and thus, drilling is not precluded by the shavings. Therefore, a printed wiring board having excellent electric connectivity and reliability can be obtained.

12 Claims, 36 Drawing Sheets

FOREIGN PATENT DOCUMENTS

| | | |
|---|---|---|
| JP | 8-90323 | 4/1996 |
| JP | 2000-315866 | 11/2000 |
| JP | 2001-341016 | 12/2001 |
| JP | 2002-144123 A | 5/2002 |
| JP | 2002-205212 | 7/2002 |
| JP | 2003-001511 | 1/2003 |
| JP | 2003-053608 | 2/2003 |
| JP | 2003-311522 A | 11/2003 |
| JP | 2004-34213 A | 2/2004 |
| JP | 2004-82318 | 3/2004 |
| JP | 2004-082318 | 3/2004 |
| JP | 2006055941 A * | 3/2006 |

* cited by examiner

Fig. 2
(A)
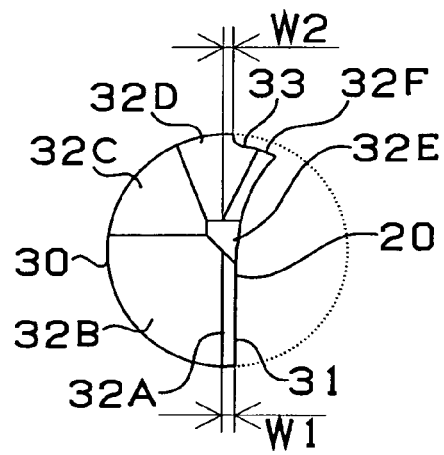
(B)
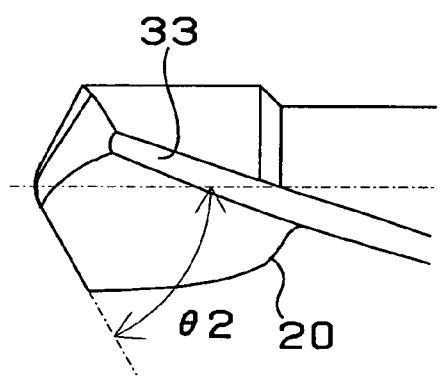
(C)
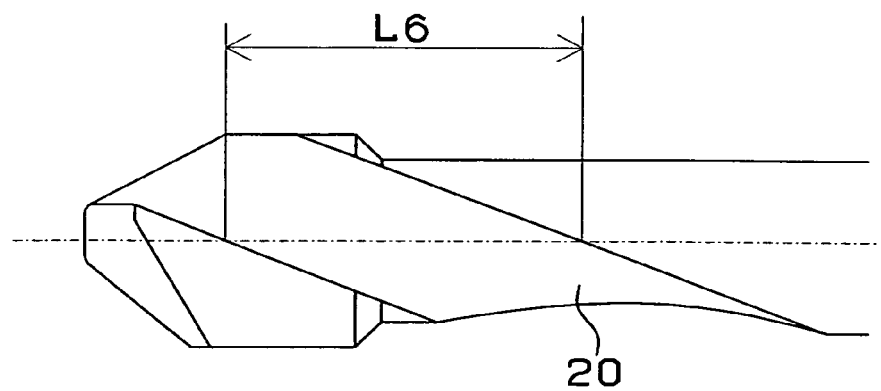

Fig. 3
(A)
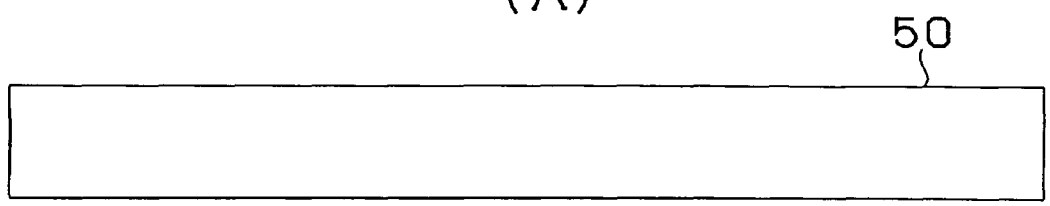
(B)
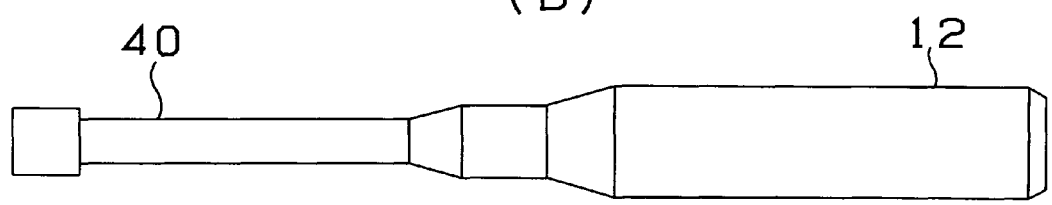
(C)
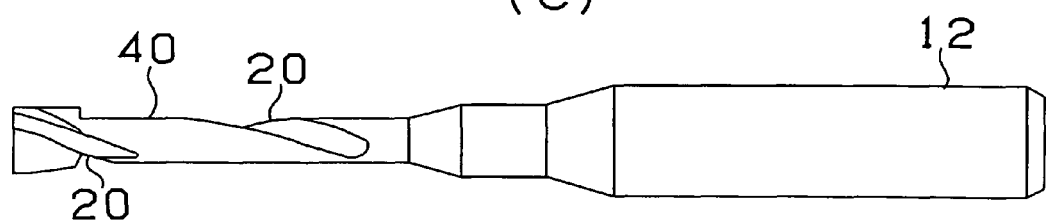
(D)
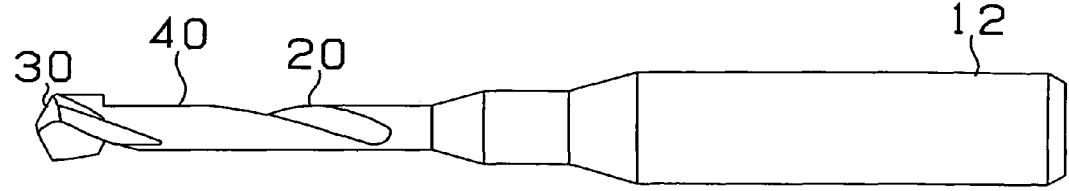

Fig. 6
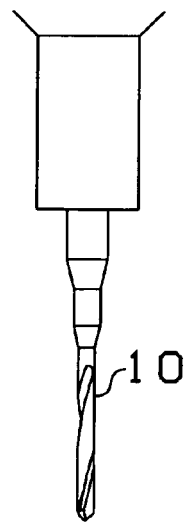
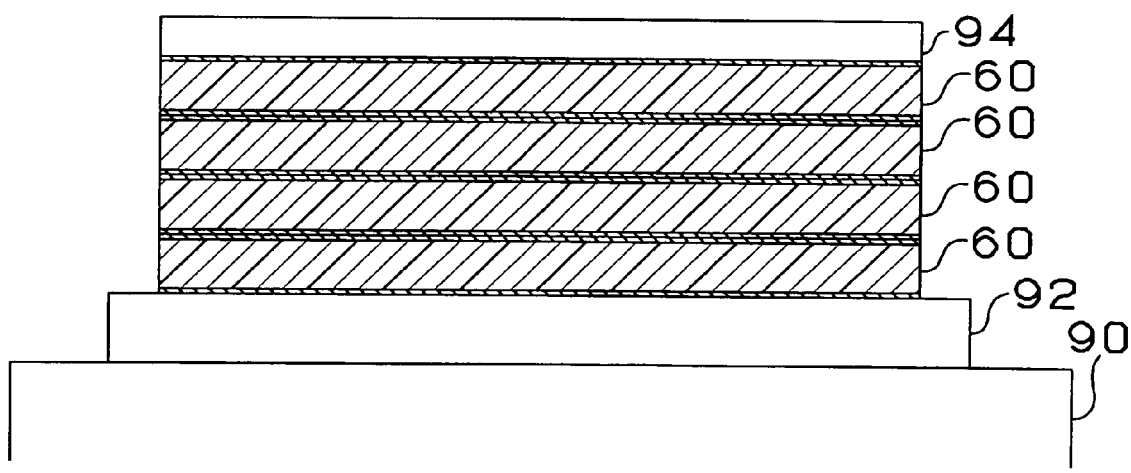

Fig. 7
Table 1

Evaluation result  Number of shots: 3000 shots

| Items | Precision of hole position | Opening shape | Electric Conductivity | Reliability |
|---|---|---|---|---|
| First Example1-1 | ○ | △ | ○ | 3000 cycle Clear |
| First Example1-2 | ○ | △ | ○ | 3000 cycle Clear |
| First Example1-3 | ○ | △ | ○ | 3000 cycle Clear |
| First Example1-4 | ○ | △ | ○ | 3000 cycle Clear |
| First Example1-5 | △ | △ | ○ | 3000 cycle Clear |
| First Reference Example1-1 | △ | △ | ○ | 3000 cycle Clear |
| First Reference Example1-2 | △ | △ | ○ | 3000 cycle NG |
| First Reference Example1-3 | △ | △ | ○ | 3000 cycle Clear |
| First Reference Example1-4 | △ | △ | ○ | 3000 cycle NG |

Evaluation result  Number of shots: 6000 shots

| Items | Precision of hole position | Opening shape | Electric Conductivity | Reliability |
|---|---|---|---|---|
| First Example1-1 | ○ | △ | ○ | 3000 cycle Clear |
| First Example1-2 | ○ | △ | ○ | 3000 cycle Clear |
| First Example1-3 | ○ | △ | ○ | 3000 cycle Clear |
| First Example1-4 | ○ | △ | ○ | 3000 cycle Clear |
| First Example1-5 | △ | △ | ○ | 3000 cycle Clear |
| First Reference Example1-1 | △ | △ | ○ | 3000 cycle NG |
| First Reference Example1-2 | △ | △ | ○ | 3000 cycle NG |
| First Reference Example1-3 | △ | △ | ○ | 3000 cycle NG |
| First Reference Example1-4 | △ | △ | ○ | 3000 cycle NG |

Fig.8
Table 2

Evaluation result  Number of shots: 3000 shots

| Items | Precision of hole position | Opening shape | Electric Conductivity | Reliability |
|---|---|---|---|---|
| First Example2-1 | ○ | ○ | ○ | 3000 cycle Clear |
| First Example2-2 | ○ | ○ | ○ | 3000 cycle Clear |
| First Example2-3 | ○ | ○ | ○ | 3000 cycle Clear |
| First Example2-4 | ○ | ○ | ○ | 3000 cycle Clear |
| First Example2-5 | △ | ○ | ○ | 3000 cycle Clear |
| First Reference Example2-1 | △ | ○ | ○ | 3000 cycle NG |
| First Reference Example2-2 | △ | ○ | ○ | 3000 cycle Clear |
| First Reference Example2-3 | △ | ○ | ○ | 3000 cycle Clear |
| First Reference Example2-4 | △ | ○ | ○ | 3000 cycle NG |

Evaluation result  Number of shots: 6000 shots

| Items | Precision of hole position | Opening shape | Electric Conductivity | Reliability |
|---|---|---|---|---|
| First Example2-1 | ○ | ○ | ○ | 3000 cycle Clear |
| First Example2-2 | ○ | ○ | ○ | 3000 cycle Clear |
| First Example2-3 | ○ | ○ | ○ | 3000 cycle Clear |
| First Example2-4 | ○ | ○ | ○ | 3000 cycle Clear |
| First Example2-5 | △ | ○ | ○ | 3000 cycle Clear |
| First Reference Example2-1 | △ | ○ | ○ | 3000 cycle NG |
| First Reference Example2-2 | △ | ○ | ○ | 3000 cycle NG |
| First Reference Example2-3 | △ | ○ | ○ | 3000 cycle NG |
| First Reference Example2-4 | △ | ○ | ○ | 3000 cycle NG |

Fig.9
Table 3

Evaluation result Number of shots: 3000 shots

| Items | Precision of hole position | Opening shape | Electric Conductivity | Reliability |
|---|---|---|---|---|
| First Example3-1 | ○ | ○ | ○ | 3000 cycle Clear |
| First Example3-2 | ○ | ○ | ○ | 3000 cycle Clear |
| First Example3-3 | ○ | ○ | ○ | 3000 cycle Clear |
| First Example3-4 | ○ | ○ | ○ | 3000 cycle Clear |
| First Example3-5 | △ | ○ | ○ | 3000 cycle Clear |
| First Reference Example3-1 | △ | ○ | ○ | 3000 cycle NG |
| First Reference Example3-2 | △ | ○ | ○ | 3000 cycle Clear |
| First Reference Example3-3 | △ | ○ | ○ | 3000 cycle Clear |
| First Reference Example3-4 | △ | ○ | ○ | 3000 cycle NG |

Evaluation result Number of shots: 6000 shots

| Items | Precision of hole position | Opening shape | Electric Conductivity | Reliability |
|---|---|---|---|---|
| First Example3-1 | ○ | ○ | ○ | 3000 cycle Clear |
| First Example3-2 | ○ | ○ | ○ | 3000 cycle Clear |
| First Example3-3 | ○ | ○ | ○ | 3000 cycle Clear |
| First Example3-4 | ○ | ○ | ○ | 3000 cycle Clear |
| First Example3-5 | △ | ○ | ○ | 3000 cycle Clear |
| First Reference Example3-1 | △ | ○ | ○ | 3000 cycle NG |
| First Reference Example3-2 | △ | ○ | ○ | 3000 cycle NG |
| First Reference Example3-3 | △ | ○ | ○ | 3000 cycle NG |
| First Reference Example3-4 | △ | ○ | ○ | 3000 cycle NG |

Fig. 10

Table 4

Evaluation result  Number of shots: 3000 shots

| Items | Precision of hole position | Opening shape | Electric Conductivity | Reliability |
|---|---|---|---|---|
| First Example4-1 | ○ | ○ | ○ | 3000 cycle Clear |
| First Example4-2 | ○ | ○ | ○ | 3000 cycle Clear |
| First Example4-3 | ○ | ○ | ○ | 3000 cycle Clear |
| First Example4-4 | ○ | ○ | ○ | 3000 cycle Clear |
| First Example4-5 | △ | ○ | ○ | 3000 cycle Clear |
| First Reference Example4-1 | △ | ○ | ○ | 3000 cycle NG |
| First Reference Example4-2 | △ | ○ | ○ | 3000 cycle Clear |
| First Reference Example4-3 | △ | ○ | ○ | 3000 cycle Clear |
| First Reference Example4-4 | △ | ○ | ○ | 3000 cycle NG |

Evaluation result  Number of shots: 6000 shots

| Items | Precision of hole position | Opening shape | Electric Conductivity | Reliability |
|---|---|---|---|---|
| First Example4-1 | ○ | ○ | ○ | 3000 cycle Clear |
| First Example4-2 | ○ | ○ | ○ | 3000 cycle Clear |
| First Example4-3 | ○ | ○ | ○ | 3000 cycle Clear |
| First Example4-4 | ○ | ○ | ○ | 3000 cycle Clear |
| First Example4-5 | △ | ○ | ○ | 3000 cycle Clear |
| First Reference Example4-1 | △ | ○ | ○ | 3000 cycle NG |
| First Reference Example4-2 | △ | ○ | ○ | 3000 cycle Clear |
| First Reference Example4-3 | △ | ○ | ○ | 3000 cycle Clear |
| First Reference Example4-4 | △ | ○ | ○ | 3000 cycle NG |

Fig. 1 1
Table 5

Evaluation result  Number of shots: 3000 shots

| Items | Precision of hole position | Opening shape | Electric Conductivity | Reliability |
|---|---|---|---|---|
| First Example5-1 | ○ | ○ | ○ | 3000 cycle Clear |
| First Example5-2 | ○ | ○ | ○ | 3000 cycle Clear |
| First Example5-3 | ○ | ○ | ○ | 3000 cycle Clear |
| First Example5-4 | ○ | ○ | ○ | 3000 cycle Clear |
| First Example5-5 | △ | ○ | ○ | 3000 cycle Clear |
| First Reference Example5-1 | △ | ○ | ○ | 3000 cycle Clear |
| First Reference Example5-2 | △ | ○ | ○ | 3000 cycle NG |
| First Reference Example5-3 | △ | ○ | ○ | 3000 cycle Clear |
| First Reference Example5-4 | △ | ○ | ○ | 3000 cycle NG |

Evaluation result  Number of shots: 6000 shots

| Items | Precision of hole position | Opening shape | Electric Conductivity | Reliability |
|---|---|---|---|---|
| First Example5-1 | ○ | ○ | ○ | 3000 cycle Clear |
| First Example5-2 | ○ | ○ | ○ | 3000 cycle Clear |
| First Example5-3 | ○ | ○ | ○ | 3000 cycle Clear |
| First Example5-4 | ○ | ○ | ○ | 3000 cycle Clear |
| First Example5-5 | △ | ○ | ○ | 3000 cycle Clear |
| First Reference Example5-1 | △ | ○ | ○ | 3000 cycle NG |
| First Reference Example5-2 | △ | ○ | ○ | 3000 cycle NG |
| First Reference Example5-3 | △ | ○ | ○ | 3000 cycle NG |
| First Reference Example5-4 | △ | ○ | ○ | 3000 cycle NG |

Fig. 1 2

Table 6

Evaluation result  Number of shots: 3000 shots

| Items | Precision of hole position | Opening shape | Electric Conductivity | Reliability |
|---|---|---|---|---|
| First Example6-1 | O | O | O | 3000 cycle Clear |
| First Example6-2 | O | O | O | 3000 cycle Clear |
| First Example6-3 | O | O | O | 3000 cycle Clear |
| First Example6-4 | O | O | O | 3000 cycle Clear |
| First Example6-5 | △ | O | O | 3000 cycle Clear |
| First Reference Example6-1 | △ | O | O | 3000 cycle NG |
| First Reference Example6-2 | △ | O | O | 3000 cycle Clear |
| First Reference Example6-3 | △ | O | O | 3000 cycle Clear |
| First Reference Example6-4 | △ | O | O | 3000 cycle NG |

Evaluation result  Number of shots: 6000 shots

| Items | Precision of hole position | Opening shape | Electric Conductivity | Reliability |
|---|---|---|---|---|
| First Example6-1 | O | O | O | 3000 cycle Clear |
| First Example6-2 | O | O | O | 3000 cycle Clear |
| First Example6-3 | O | O | O | 3000 cycle Clear |
| First Example6-4 | O | O | O | 3000 cycle Clear |
| First Example6-5 | △ | O | O | 3000 cycle Clear |
| First Reference Example6-1 | △ | O | O | 3000 cycle NG |
| First Reference Example6-2 | △ | O | O | 3000 cycle Clear |
| First Reference Example6-3 | △ | O | O | 3000 cycle Clear |
| First Reference Example6-4 | △ | O | O | 3000 cycle NG |

Fig. 1 3
Table 7

Evaluation result  Number of shots: 3000 shots

| Items | Precision of hole position | Opening shape | Electric Conductivity | Reliability |
|---|---|---|---|---|
| First Example7-1 | ○ | ○ | ○ | 3000 cycle Clear |
| First Example7-2 | ○ | ○ | ○ | 3000 cycle Clear |
| First Example7-3 | ○ | ○ | ○ | 3000 cycle Clear |
| First Example7-4 | ○ | ○ | ○ | 3000 cycle Clear |
| First Example7-5 | ○ | ○ | ○ | 3000 cycle Clear |
| First Reference Example7-1 | △ | ○ | ○ | 3000 cycle NG |
| First Reference Example7-2 | △ | ○ | ○ | 3000 cycle Clear |
| First Reference Example7-3 | △ | ○ | ○ | 3000 cycle NG |
| First Reference Example7-4 | △ | ○ | ○ | 3000 cycle Clear |

Evaluation result  Number of shots: 6000 shots

| Items | Precision of hole position | Opening shape | Electric Conductivity | Reliability |
|---|---|---|---|---|
| First Example7-1 | ○ | ○ | ○ | 3000 cycle Clear |
| First Example7-2 | ○ | ○ | ○ | 3000 cycle Clear |
| First Example7-3 | ○ | ○ | ○ | 3000 cycle Clear |
| First Example7-4 | ○ | ○ | ○ | 3000 cycle Clear |
| First Example7-5 | ○ | ○ | ○ | 3000 cycle Clear |
| First Reference Example7-1 | △ | △ | ○ | 3000 cycle NG |
| First Reference Example7-2 | △ | ○ | ○ | 3000 cycle NG |
| First Reference Example7-3 | △ | ○ | ○ | 3000 cycle NG |
| First Reference Example7-4 | △ | ○ | ○ | 3000 cycle NG |

Fig. 14

Table 8

Evaluation result  Number of shots: 3000 shots

| Items | Precision of hole position | Opening shape | Electric Conductivity | Reliability |
|---|---|---|---|---|
| First Example8-1 | △ | ○ | ○ | 3000 cycle Clear |
| First Example8-2 | △ | ○ | ○ | 3000 cycle Clear |
| First Example8-3 | ○ | ○ | ○ | 3000 cycle Clear |
| First Example8-4 | ○ | ○ | ○ | 3000 cycle Clear |
| First Example8-5 | ○ | △ | ○ | 3000 cycle Clear |
| First Reference Example8-1 | △ | ○ | ○ | 3000 cycle NG |
| First Reference Example8-2 | △ | ○ | ○ | 3000 cycle Clear |
| First Reference Example8-3 | △ | ○ | ○ | 3000 cycle Clear |

Evaluation result  Number of shots: 6000 shots

| Items | Precision of hole position | Opening shape | Electric Conductivity | Reliability |
|---|---|---|---|---|
| First Example8-1 | △ | ○ | ○ | 3000 cycle Clear |
| First Example8-2 | △ | ○ | ○ | 3000 cycle Clear |
| First Example8-3 | ○ | ○ | ○ | 3000 cycle Clear |
| First Example8-4 | ○ | ○ | ○ | 3000 cycle Clear |
| First Example8-5 | ○ | △ | ○ | 3000 cycle Clear |
| First Reference Example8-1 | × | ○ | ○ | 3000 cycle NG |
| First Reference Example8-2 | △ | ○ | ○ | 3000 cycle NG |
| First Reference Example8-3 | △ | ○ | ○ | 3000 cycle NG |

Fig.15
Table 8

Number of laminated boards Four  Evaluation result  Number of shots: 3000 shots

| Items | Precision of hole position | Opening shape | Electric Conductivity | Reliability |
|---|---|---|---|---|
| First Example9-1 | O | O | O | 3000 cycle Clear |
| First Example9-2 | O | O | O | 3000 cycle Clear |
| First Example9-3 | O | O | O | 3000 cycle Clear |
| First Example9-4 | O | O | O | 3000 cycle Clear |
| First Example9-5 | O | O | O | 3000 cycle Clear |
| First Example9-6 | O | O | O | 3000 cycle Clear |
| First Example9-7 | – | – | – | – |
| First Example9-8 | – | – | – | – |
| First Reference Example9-1 | O | △ | O | 3000 cycle Clear |
| First Reference Example9-2 | O | △ | O | 3000 cycle Clear |

Number of laminated boards Four Evaluation result  Number of shots: 6000 shots

| Items | Precision of hole position | Opening shape | Electric Conductivity | Reliability |
|---|---|---|---|---|
| First Example9-1 | O | O | O | 3000 cycle Clear |
| First Example9-2 | O | O | O | 3000 cycle Clear |
| First Example9-3 | O | O | O | 3000 cycle Clear |
| First Example9-4 | O | O | O | 3000 cycle Clear |
| First Example9-5 | O | O | O | 3000 cycle Clear |
| First Example9-6 | O | O | O | 3000 cycle Clear |
| First Example9-7 | – | – | – | – |
| First Example9-8 | – | – | – | – |
| First Reference Example9-1 | O | △ | O | 3000 cycle Clear |
| First Reference Example9-2 | △ | △ | O | 3000 cycle NG |

Number of laminated boards Three  Evaluation result  Number of shots: 3000 shots

| Items | Precision of hole position | Opening shape | Electric Conductivity | Reliability |
|---|---|---|---|---|
| First Example9-1 | O | O | O | 3000 cycle Clear |
| First Example9-7 | O | O | O | 3000 cycle Clear |
| First Example9-8 | – | – | – | – |

Number of laminated boards Two  Evaluation result  Number of shots: 3000 shots

| Items | Precision of hole position | Opening shape | Electric Conductivity | Reliability |
|---|---|---|---|---|
| First Example9-1 | O | O | O | 3000 cycle Clear |
| First Example9-7 | O | O | O | 3000 cycle Clear |
| First Example9-8 | O | O | O | 3000 cycle Clear |

Fig. 1 6

Table 1 0

Breakage evaluation

| Items | Number of laminated boards | Number of shots | | |
|---|---|---|---|---|
| | | 1000 | 3000 | 6000 |
| First Example9-1 | 4 | ○ | ○ | ○ |
| | 3 | ○ | ○ | ○ |
| | 2 | ○ | ○ | ○ |
| First Example9-2 | 4 | ○ | ○ | ○ |
| First Example9-3 | 4 | ○ | ○ | ○ |
| First Example9-4 | 4 | ○ | ○ | ○ |
| First Example9-5 | 4 | ○ | ○ | ○ |
| First Example9-6 | 4 | ○ | ○ | ○ |
| First Example9-7 | 4 | ○ | × | × |
| | 3 | ○ | ○ | × |
| | 2 | ○ | ○ | ○ |
| First Example9-8 | 4 | × | × | × |
| | 3 | ○ | × | × |
| | 2 | ○ | ○ | × |
| First Reference Example9-1 | 4 | ○ | ○ | ○ |
| First Reference Example9-2 | 4 | ○ | ○ | ○ |

Fig. 17

Table 10

Evaluation result  Number of shots: 3000 shots

| Items | Precision of hole position | Opening shape | Electric Conductivity | Reliability |
|---|---|---|---|---|
| Comparative Example1 | △ | ○ | ○ | 2000 cycle NG |
| Comparative Example2 | △ | ○ | ○ | 2000 cycle NG |
| Comparative Example3 | × | × | ○ | 1500 cycle NG |
| Comparative Example4 | × | × | ○ | 2000 cycle NG |
| Comparative Example5 | × | × | ○ | 2000 cycle NG |
| Comparative Example6 | × | × | ○ | 1500 cycle NG |
| Comparative Example7 | × | × | ○ | 2000 cycle NG |
| Comparative Example8 | × | × | ○ | 2000 cycle NG |

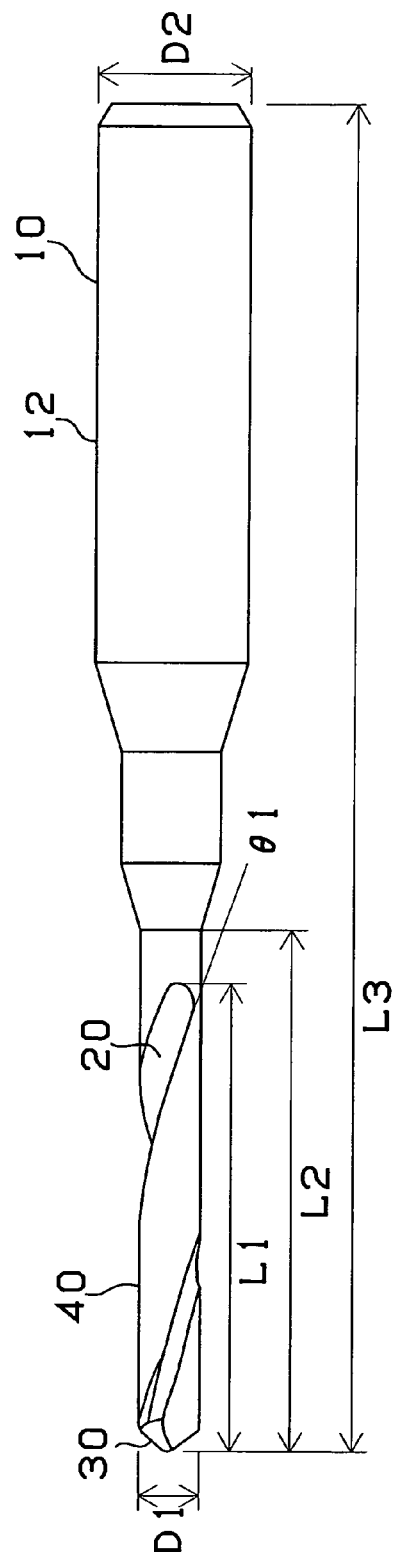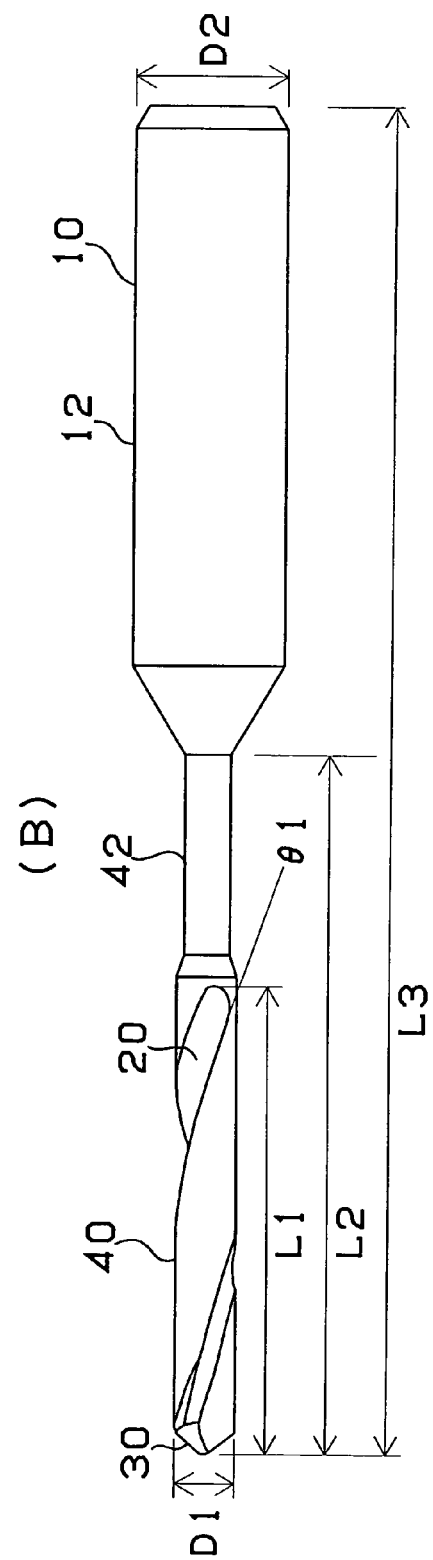
Fig. 18

Fig.20
(A)
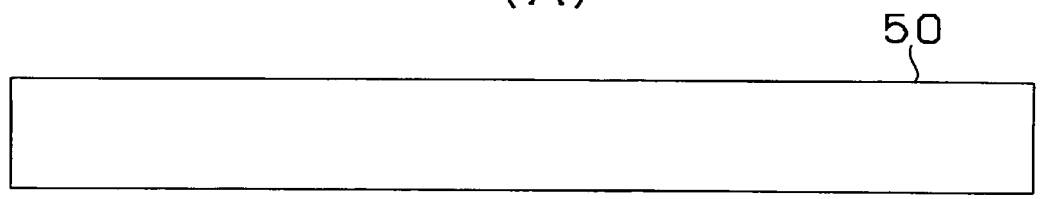
(B)
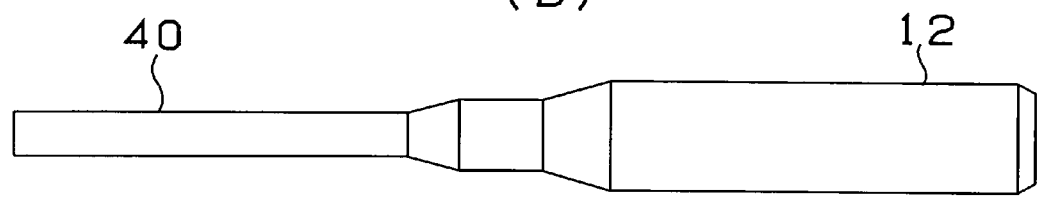
(C)
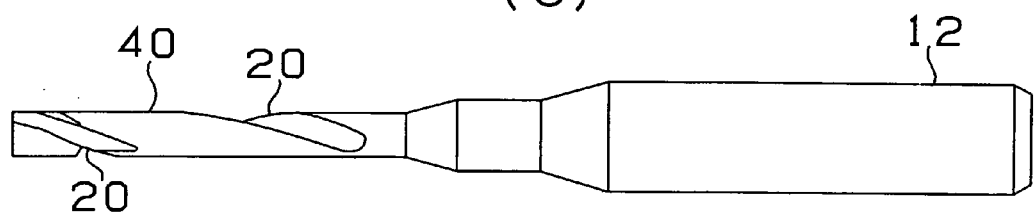
(D)
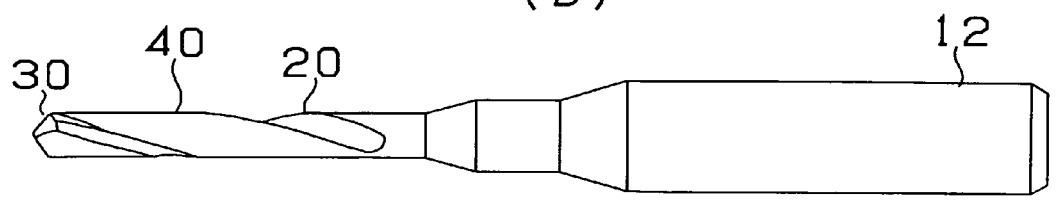

Fig.21
(A)
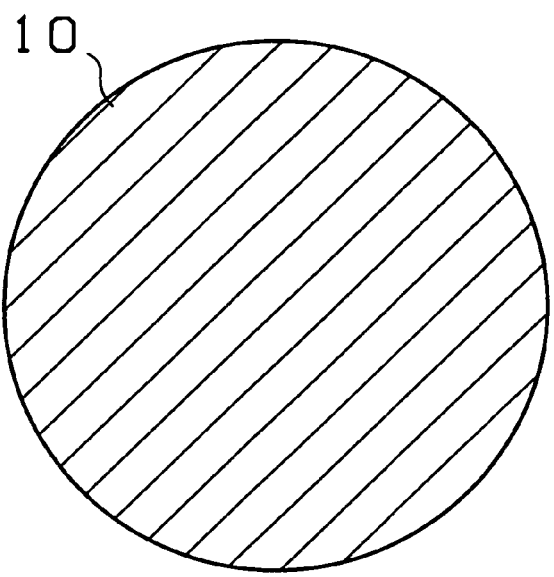
(B)
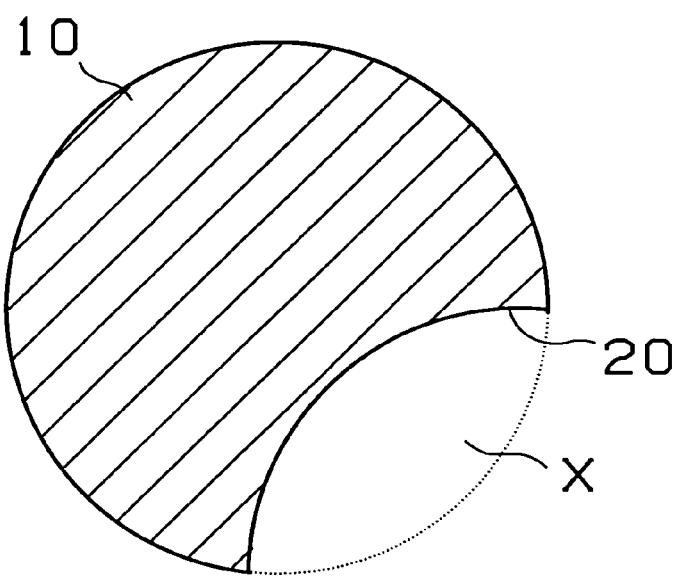

Fig. 22
(A)
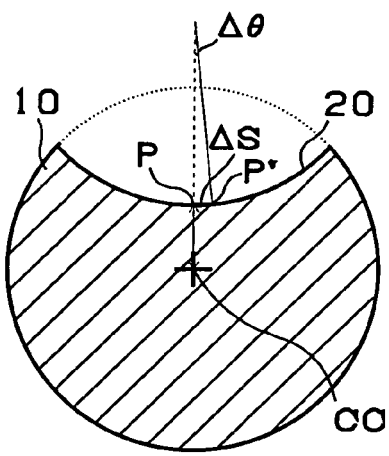
(B)
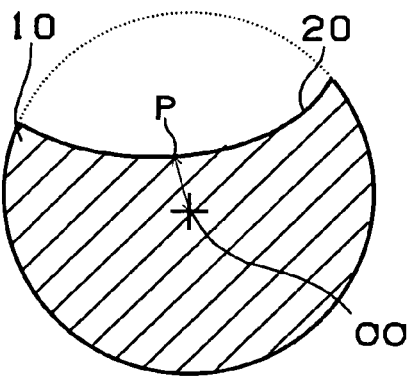
(C)
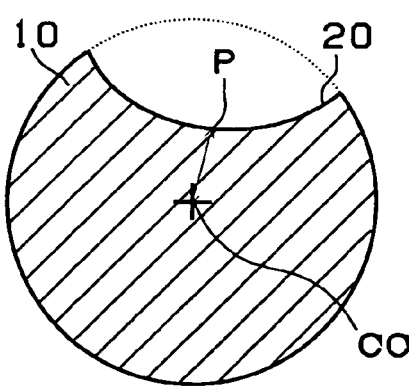

Fig. 2 3

Evaluation result   Number of shots: 3000 shots

| Items | Precision of hole position | Smear residue | Electric conductivity | Reliability |
|---|---|---|---|---|
| Second Example1-1 | ○ | ○ | ○ | 4000 cycle Clear |
| Second Example1-2 | ○ | ○ | ○ | 4000 cycle Clear |
| Second Example1-3 | ○ | ○ | ○ | 4000 cycle Clear |
| Second Reference Example1-1 | △ | ○ | ○ | 4000 cycle NG |
| Second Reference Example1-2 | △ | ○ | ○ | 4000 cycle Clear |

Evaluation result   Number of shots: 6000 shots

| Items | Precision of hole position | Smear residue | Electric conductivity | Reliability |
|---|---|---|---|---|
| Second Example1-1 | ○ | ○ | ○ | 4000 cycle Clear |
| Second Example1-2 | ○ | ○ | ○ | 4000 cycle Clear |
| Second Example1-3 | ○ | ○ | ○ | 4000 cycle Clear |
| Second Reference Example1-1 | △ | ○ | ○ | 4000 cycle NG |
| Second Reference Example1-2 | △ | ○ | ○ | 4000 cycle NG |

Fig. 2 4

Evaluation result  Number of shots: 3000 shots

| Items | Precision of hole position | Smear residue | Electric conductivity | Reliability |
|---|---|---|---|---|
| Second Example2-1 | ○ | ○ | ○ | 4000 cycle Clear |
| Second Example2-2 | ○ | ○ | ○ | 4000 cycle Clear |
| Second Example2-3 | ○ | ○ | ○ | 4000 cycle Clear |
| Second Reference Example2-1 | △ | ○ | ○ | 4000 cycle NG |
| Second Reference Example2-2 | △ | ○ | ○ | 4000 cycle Clear |

Evaluation result  Number of shots: 6000 shots

| Items | Precision of hole position | Smear residue | Electric conductivity | Reliability |
|---|---|---|---|---|
| Second Example2-1 | ○ | ○ | ○ | 4000 cycle Clear |
| Second Example2-2 | ○ | ○ | ○ | 4000 cycle Clear |
| Second Example2-3 | ○ | ○ | ○ | 4000 cycle Clear |
| Second Reference Example2-1 | △ | ○ | ○ | 4000 cycle NG |
| Second Reference Example2-2 | △ | ○ | ○ | 4000 cycle NG |

Fig. 2 5

Evaluation result  Number of shots: 3000 shots

| Items | Precision of hole position | Smear residue | Electric conductivity | Reliability |
|---|---|---|---|---|
| Second Example3-1 | ○ | ○ | ○ | 4000 cycle Clear |
| Second Example3-2 | ○ | ○ | ○ | 4000 cycle Clear |
| Second Example3-3 | ○ | ○ | ○ | 4000 cycle Clear |
| Second Reference Example3-1 | △ | ○ | ○ | 4000 cycle NG |
| Second Reference Example3-2 | △ | ○ | ○ | 4000 cycle Clear |

Evaluation result  Number of shots: 6000 shots

| Items | Precision of hole position | Smear residue | Electric conductivity | Reliability |
|---|---|---|---|---|
| Second Example3-1 | ○ | ○ | ○ | 4000 cycle Clear |
| Second Example3-2 | ○ | ○ | ○ | 4000 cycle Clear |
| Second Example3-3 | ○ | ○ | ○ | 4000 cycle Clear |
| Second Reference Example3-1 | △ | ○ | ○ | 4000 cycle NG |
| Second Reference Example3-2 | △ | ○ | ○ | 4000 cycle NG |

Fig. 26

Evaluation result   Number of shots: 3000 shots

| Items | Precision of hole position | Smear residue | Electric conductivity | Reliability |
|---|---|---|---|---|
| Second Modified Example 1-1 | ○ | ○ | ○ | 4000 cycle Clear |
| Second Modified Example 1-2 | ○ | ○ | ○ | 4000 cycle Clear |
| Second Modified Example 1-3 | ○ | ○ | ○ | 4000 cycle Clear |
| Second Modified Example 1-4 | ○ | ○ | ○ | 4000 cycle Clear |
| Second Modified Example 1-5 | ○ | ○ | ○ | 4000 cycle Clear |
| Second Modified Example 1-6 | ○ | ○ | ○ | 4000 cycle Clear |
| Second Modified Example 1-7 | ○ | ○ | ○ | 4000 cycle Clear |
| Second Modified Example 1-8 | ○ | ○ | ○ | 4000 cycle Clear |

Evaluation result   Number of shots: 6000 shots

| Items | Precision of hole position | Smear residue | Electric conductivity | Reliability |
|---|---|---|---|---|
| Second Modified Example 1-1 | ○ | ○ | ○ | 4000 cycle Clear |
| Second Modified Example 1-2 | ○ | ○ | ○ | 4000 cycle Clear |
| Second Modified Example 1-3 | ○ | ○ | ○ | 4000 cycle Clear |
| Second Modified Example 1-4 | ○ | ○ | ○ | 4000 cycle Clear |
| Second Modified Example 1-5 | ○ | ○ | ○ | 4000 cycle Clear |
| Second Modified Example 1-6 | ○ | ○ | ○ | 4000 cycle Clear |
| Second Modified Example 1-7 | ○ | ○ | ○ | 4000 cycle Clear |
| Second Modified Example 1-8 | ○ | ○ | ○ | 4000 cycle Clear |

Fig. 2 7

Evaluation result  Number of shots: 3000 shots

| Items | Precision of hole position | Smear residue | Electric conductivity | Reliability |
|---|---|---|---|---|
| Second Modified Example 2-1 | ○ | ○ | ○ | 4000 cycle Clear |
| Second Modified Example 2-2 | ○ | ○ | ○ | 4000 cycle Clear |
| Second Modified Example 2-3 | ○ | ○ | ○ | 4000 cycle Clear |
| Second Modified Example 2-4 | ○ | ○ | ○ | 4000 cycle Clear |
| Second Modified Example 2-5 | ○ | ○ | ○ | 4000 cycle Clear |
| Second Modified Example 2-6 | ○ | ○ | ○ | 4000 cycle Clear |
| Second Modified Example 2-7 | ○ | ○ | ○ | 4000 cycle Clear |
| Second Modified Example 2-8 | ○ | ○ | ○ | 4000 cycle Clear |

Evaluation result  Number of shots: 6000 shots

| Items | Precision of hole position | Smear residue | Electric conductivity | Reliability |
|---|---|---|---|---|
| Second Modified Example 2-1 | ○ | ○ | ○ | 4000 cycle Clear |
| Second Modified Example 2-2 | ○ | ○ | ○ | 4000 cycle Clear |
| Second Modified Example 2-3 | ○ | ○ | ○ | 4000 cycle Clear |
| Second Modified Example 2-4 | ○ | ○ | ○ | 4000 cycle Clear |
| Second Modified Example 2-5 | ○ | ○ | ○ | 4000 cycle Clear |
| Second Modified Example 2-6 | ○ | ○ | ○ | 4000 cycle Clear |
| Second Modified Example 2-7 | ○ | ○ | ○ | 4000 cycle Clear |
| Second Modified Example 2-8 | ○ | ○ | ○ | 4000 cycle Clear |

Fig. 28

Evaluation result    Number of shots: 3000 shots

| Items | Precision of hole position | Smear residue | Electric conductivity | Reliability |
|---|---|---|---|---|
| Second Modified Example 3-1 | ○ | ○ | ○ | 4000 cycle Clear |
| Second Modified Example 3-2 | ○ | ○ | ○ | 4000 cycle Clear |
| Second Modified Example 3-3 | ○ | ○ | ○ | 4000 cycle Clear |
| Second Modified Example 3-4 | ○ | ○ | ○ | 4000 cycle Clear |
| Second Modified Example 3-5 | ○ | ○ | ○ | 4000 cycle Clear |
| Second Modified Example 3-6 | ○ | ○ | ○ | 4000 cycle Clear |
| Second Modified Example 3-7 | ○ | ○ | ○ | 4000 cycle Clear |
| Second Modified Example 3-8 | ○ | ○ | ○ | 4000 cycle Clear |

Evaluation result    Number of shots: 6000 shots

| Items | Precision of hole position | Smear residue | Electric conductivity | Reliability |
|---|---|---|---|---|
| Second Modified Example 3-1 | ○ | ○ | ○ | 4000 cycle Clear |
| Second Modified Example 3-2 | ○ | ○ | ○ | 4000 cycle Clear |
| Second Modified Example 3-3 | ○ | ○ | ○ | 4000 cycle Clear |
| Second Modified Example 3-4 | ○ | ○ | ○ | 4000 cycle Clear |
| Second Modified Example 3-5 | ○ | ○ | ○ | 4000 cycle Clear |
| Second Modified Example 3-6 | ○ | ○ | ○ | 4000 cycle Clear |
| Second Modified Example 3-7 | ○ | ○ | ○ | 4000 cycle Clear |
| Second Modified Example 3-8 | ○ | ○ | ○ | 4000 cycle Clear |

Fig. 2 9

Evaluation result  Number of shots: 3000 shots

| Items | Precision of hole position | Smear residue | Electric conductivity | Reliability |
|---|---|---|---|---|
| Second Modified Example 4-1 | ○ | ○ | ○ | 4000 cycle Clear |
| Second Modified Example 4-2 | ○ | ○ | ○ | 4000 cycle Clear |
| Second Modified Example 4-3 | ○ | ○ | ○ | 4000 cycle Clear |
| Second Modified Example 4-4 | ○ | ○ | ○ | 4000 cycle Clear |
| Second Modified Example 4-5 | ○ | ○ | ○ | 4000 cycle Clear |
| Second Modified Example 4-6 | ○ | ○ | ○ | 4000 cycle Clear |
| Second Modified Example 4-7 | ○ | ○ | ○ | 4000 cycle Clear |
| Second Modified Example 4-8 | ○ | ○ | ○ | 4000 cycle Clear |

Evaluation result  Number of shots: 6000 shots

| Items | Precision of hole position | Smear residue | Electric conductivity | Reliability |
|---|---|---|---|---|
| Second Modified Example 4-1 | ○ | ○ | ○ | 4000 cycle Clear |
| Second Modified Example 4-2 | ○ | ○ | ○ | 4000 cycle Clear |
| Second Modified Example 4-3 | ○ | ○ | ○ | 4000 cycle Clear |
| Second Modified Example 4-4 | ○ | ○ | ○ | 4000 cycle Clear |
| Second Modified Example 4-5 | ○ | ○ | ○ | 4000 cycle Clear |
| Second Modified Example 4-6 | ○ | ○ | ○ | 4000 cycle Clear |
| Second Modified Example 4-7 | ○ | ○ | ○ | 4000 cycle Clear |
| Second Modified Example 4-8 | ○ | ○ | ○ | 4000 cycle Clear |

Fig. 30

Evaluation result   Number of shots: 3000 shots

| Items | Precision of hole position | Smear residue | Electric conductivity | Reliability |
|---|---|---|---|---|
| Second Modified Example 5-1 | ○ | ○ | ○ | 4000 cycle Clear |
| Second Modified Example 5-2 | ○ | ○ | ○ | 4000 cycle Clear |
| Second Modified Example 5-3 | ○ | ○ | ○ | 4000 cycle Clear |
| Second Modified Example 5-4 | ○ | ○ | ○ | 4000 cycle Clear |
| Second Modified Example 5-5 | ○ | ○ | ○ | 4000 cycle Clear |
| Second Modified Example 5-6 | ○ | ○ | ○ | 4000 cycle Clear |
| Second Modified Example 5-7 | ○ | ○ | ○ | 4000 cycle Clear |
| Second Modified Example 5-8 | ○ | ○ | ○ | 4000 cycle Clear |

Evaluation result   Number of shots: 6000 shots

| Items | Precision of hole position | Smear residue | Electric conductivity | Reliability |
|---|---|---|---|---|
| Second Modified Example 5-1 | ○ | ○ | ○ | 4000 cycle Clear |
| Second Modified Example 5-2 | ○ | ○ | ○ | 4000 cycle Clear |
| Second Modified Example 5-3 | ○ | ○ | ○ | 4000 cycle Clear |
| Second Modified Example 5-4 | ○ | ○ | ○ | 4000 cycle Clear |
| Second Modified Example 5-5 | ○ | ○ | ○ | 4000 cycle Clear |
| Second Modified Example 5-6 | ○ | ○ | ○ | 4000 cycle Clear |
| Second Modified Example 5-7 | ○ | ○ | ○ | 4000 cycle Clear |
| Second Modified Example 5-8 | ○ | ○ | ○ | 4000 cycle Clear |

Fig. 3 1

Evaluation result   Number of shots: 3000 shots

| Items | Precision of hole position | Smear residue | Electric conductivity | Reliability |
|---|---|---|---|---|
| Second Comparative Example 1-1 | △ | × | ○ | 3000 cycle NG |
| Second Comparative Example 1-2 | △ | × | ○ | 3000 cycle NG |
| Second Comparative Example 1-3 | × | × | ○ | 3000 cycle NG |
| Second Comparative Example 1-4 | × | × | ○ | 2000 cycle NG |
| Second Comparative Example 1-5 | × | × | ○ | 2000 cycle NG |

Evaluation result   Number of shots: 3000 shots

| Items | Precision of hole position | Smear residue | Electric conductivity | Reliability |
|---|---|---|---|---|
| Second Comparative Example 2-1 | △ | × | ○ | 2000 cycle NG |
| Second Comparative Example 2-2 | △ | × | ○ | 2000 cycle NG |
| Second Comparative Example 2-3 | × | × | ○ | 2000 cycle NG |
| Second Comparative Example 2-4 | × | × | ○ | 2000 cycle NG |
| Second Comparative Example 2-5 | × | × | ○ | 2000 cycle NG |

Fig. 3 2

| Items | Number of shots when damage was found |
|---|---|
| Second Example1-1 | 7200 |
| Second Example1-2 | 7100 |
| Second Example1-3 | 7000 |
| Second Reference Example1-1 | 6200 |
| Second Reference Example1-2 | 6100 |

| Items | Number of shots when damage was found |
|---|---|
| Second Example2-1 | 7200 |
| Second Example2-2 | 6800 |
| Second Example2-3 | 6700 |
| Second Reference Example2-1 | 6100 |
| Second Reference Example2-2 | 6100 |

| Items | Number of shots when damage was found |
|---|---|
| Second Example3-1 | 7000 |
| Second Example3-2 | 6400 |
| Second Example3-3 | 6500 |
| Second Reference Example3-1 | 6000 |
| Second Reference Example3-2 | 6000 |

| Items | Number of shots when damage was found |
|---|---|
| Modified Example 1－1 | 7200 |
| Modified Example 1－2 | 7200 |
| Modified Example 1－3 | 7500 |
| Modified Example 1－4 | 7400 |
| Modified Example 1－5 | 7000 |
| Modified Example 1－6 | 7000 |
| Modified Example 1－7 | 6900 |
| Modified Example 1－8 | 6900 |

Fig. 3 3

| Items | Number of shots when damage was found |
|---|---|
| Second Modified Example2-1 | 7000 |
| Second Modified Example2-2 | 6900 |
| Second Modified Example2-3 | 6800 |
| Second Modified Example2-4 | 6900 |
| Second Modified Example2-5 | 6800 |
| Second Modified Example2-6 | 6800 |
| Second Modified Example2-7 | 6700 |
| Second Modified Example2-8 | 6800 |

| Items | Number of shots when damage was found |
|---|---|
| Second Modified Example3-1 | 7000 |
| Second Modified Example3-2 | 7000 |
| Second Modified Example3-3 | 6900 |
| Second Modified Example3-4 | 6800 |
| Second Modified Example3-5 | 6900 |
| Second Modified Example3-6 | 6800 |
| Second Modified Example3-7 | 6900 |
| Second Modified Example3-8 | 6800 |

| Items | Number of shots when damage was found |
|---|---|
| Second Modified Example4-1 | 6800 |
| Second Modified Example4-2 | 6700 |
| Second Modified Example4-3 | 6800 |
| Second Modified Example4-4 | 6600 |
| Second Modified Example4-5 | 6700 |
| Second Modified Example4-6 | 6800 |
| Second Modified Example4-7 | 6800 |
| Second Modified Example4-8 | 6600 |

Fig. 34

| Items | Number of shots when damage was found |
|---|---|
| Second Modified Example5-1 | 6800 |
| Second Modified Example5-2 | 6700 |
| Second Modified Example5-3 | 6800 |
| Second Modified Example5-4 | 6600 |
| Second Modified Example5-5 | 6800 |
| Second Modified Example5-6 | 6700 |
| Second Modified Example5-7 | 6800 |
| Second Modified Example5-8 | 6800 |

| Items | Number of shots when damage was found |
|---|---|
| Second Comparative Example1-1 | 4100 |
| Second Comparative Example1-2 | 4400 |
| Second Comparative Example1-3 | 5000 |
| Second Comparative Example1-4 | 4800 |
| Second Comparative Example1-5 | 4600 |

| Items | Number of shots when damage was found |
|---|---|
| Second Comparative Example2-1 | 5100 |
| Second Comparative Example2-2 | 5000 |
| Second Comparative Example2-3 | 5200 |
| Second Comparative Example2-4 | 4900 |
| Second Comparative Example2-5 | 4800 |

DRILL AND METHOD OF PRODUCING PRINTED CIRCUIT BOARD

TECHNICAL FIELD

The present invention relates to a drill used for a printed wiring board. In particular, the present invention relates to a drill for a laminate board having laminated thereon a double-sided copper foil of a resin board that configures a printed wiring board and a method for manufacturing a printed wiring board using the drill.

BACKGROUND ART

A through hole is formed in order to obtain electric conductivity of a top and a bottom of a printed wiring board. As an example thereof, a penetration opening is formed through a double-sided copper plated laminate board by means of a drill, an electric conductor layer is formed at the opening by means of plating or the like, and etching is applied as necessary, thereby forming a circuit. In this manner, a printed wiring board having an electric conductor circuit and enabling electric conductivity of a top and a bottom is formed. These wiring boards are prepared in plurality, and then, a further multi-layered printed wiring board is obtained via a prepreg. Alternatively, while a wiring board having a through hole is used as a core, an inter-layered insulation layer and an electric conductor layer are formed to obtain a multi-layered printed wiring board.

In recent years, with a growing demand for high density of a printed wiring board, reducing an drilling diameter of a through hole more remarkably has been discussed.

In order to manufacture a printed wiring board along the above growing demand, there is a need for a small diameter drill for opening a small diameter through hole. Such a small diameter drill is disclosed in Utility Model JP 7-33514 A or JP 2004-82318 A and the like.

According to JP 2004-82318 A, rigidity is enhanced, and good hole precision is obtained by using a drill having formed thereon a shaving discharge groove formed in one stripe, the drill having $5/100$ or less in diameter with respect to the maximum outer diameter of a blade tip portion.

DISCLOSURE OF THE INVENTION

Problem to be Solved by the Invention

However, in a conventional drill, positional precision of a hole to be drilled has been lowered due to a change of conditions such as a material for a board to be drilled or a drilling condition. Namely, a positional shift from a desired position occurs. In addition, at a drilled inner wall portion, unwanted irregularities have been formed. Therefore, if an electric conductor layer is applied into the displaced opening or the opening formed with irregularities to form a through hole, electrical connectivity or reliability has been lowered and earlier degradation has occurred if a reliability test such as a heat cycle test or a high temperature placement test is carried out.

In drilling using a drill, in order to enhance processing efficiency, a plurality of printed wiring boards are laminated on each other, and are drilled at the same time. At the time of simultaneous drilling processing, there is a demand for all of the printed wiring boards to be drilled at the same position and in the same shape, regardless of the number of printed wiring boards. On a printed wiring board placed at an upper side a relatively preferable opening can be formed, whereas a positional shift or irregularities has occurred on a printed wiring board at a lower side.

In addition, if the use frequency of a drill becomes high (the number of drilling shots becomes large), for example, there further appears a failure described from when 4500 holes that are the end of service life have been drilled by means of a drill to be exchanged when 6000 holes have been drilled.

Further, as a drilling diameter is reduced, in particular, at the time of carrying out drilling of an opening diameter of 400 microns or less, the frequency that the failure occurs has increased.

The present invention has been made in order to address the issues described above. It is an object of the present on to provide a drill featured in that a positional shift on a drilled hole or irregularities on an internal wall of the drilled hole are not formed.

In addition, it is a still further object of the present invention to propose a drill featured in that, even if the use frequency of the drill is increased, a formed through hole does not cause a failure such as a positional shift and does not degrade electrical connectivity or reliability.

In addition, it is indispensable that, in an electric conductor circuit of a printed wiring board a through hole or a via-hole is reduced in diameter with a demand for the achievement of making fine or higher density. Concurrently, it has been discussed that the diameter of the through hole to be drilled on the board is reduced by using a drill whose drilling diameter is reduced more remarkably than conventional (for example, the use of a drill whose drilling diameter is equal to or smaller than 300 microns or a drill whose drilling diameter is equal to or smaller than 150 microns is also included).

In general, in drilling, with a higher use frequency (drilling a board one time by a drill is referred to as one shot, and the number of shots denotes the use frequency), the drill is worn and torn, and thus, a drill damage (that denotes drill breaks, drill missing, or drill deformation) or preclusion from forming a hole occurs (for example, irregularities occurs on an internal wall of a drilled hole or deformation occurs). Therefore, the drill is exchanged in advance when a predetermined number of shots has been reached.

In addition, even with a drill whose specified number of shots has been reached, as long as the degree of damage is light, regrinding of a distal end portion or the like is applied, whereby the drill can be used again, and then, board drilling can be carried out.

However, if the drill is reduced in diameter, the strength of the drill per se is lowered. Therefore, a drill damage is likely to occur, a shape failure of a through hole formed on the board is likely to occur, and a positional shift of the through hole is likely to occur. As a result, electrical connectivity or reliability is easily lowered.

Further, if the use frequency of these drills becomes high, tendency of a failure (hole shape failure or positional shift) becomes high, and electrical connectivity or reliability is easily lowered.

It is a still further object of the present invention to propose a small diameter drill featured in that, even if a use frequency is increased, a damage hardly occurs, a formed through hole does not cause a failure such as a positional shift, and electrical connectivity or reliability is not lowered.

Means for Attaining the Issue(s)

As a result of an utmost study of the inventors, it was found preferable to use a drill having formed thereon a distal end blade portion and a shaving discharge groove of a body, in which the shaving discharge groove of the body is formed in a continuous one stripe and a torsion angle of the shaving discharge groove is in the range of 30 degrees to 50 degrees.

When using the drill whose torsion angle is in the range of 30 degrees to 50 degrees, a positional shift of a through hole is reduced, and in other words, the hole forming precision is improved. In addition, the drilled shavings are properly discharged, and thus, the drilling is not precluded by the shavings. Therefore, a printed wiring board having its excellent electrical connectivity or reliability can be obtained. In addition, the wear and tear of a drill associated with its use can be restricted, and therefore, the usable count can be extended more significantly than conventional, and the precision or shape of the hole to be drilled is hardly lowered.

If drilling is precluded by shavings, a positional shift of a hole occurs or irregularities are formed on an internal wall of the hole. Therefore, electrical connectivity or reliability may be lowered. Such shavings easily apply an excessive stress to a drill, and thus, the wear and tear of the drill is accelerated.

In the case where the torsion angle is less than 30 degrees or the torsion angle exceeds 50 degrees, the shavings are hardly discharged. Therefore, the shaving precludes drilling caused by a drill, causes a positional shift of a hole or forms irregularities on the internal wall of the hole, thus degrading electrical connectivity or reliability. In addition, the wear and tear of the drill is advanced due to the shavings that are not discharged. Accordingly, the drill deteriorates with a small use frequency.

It is further desirable that the torsion angle be in the range of 35 degrees to 45 degrees. In this range, the shavings can be efficiently discharged regardless of drilling conditions such as a rotation frequency or a drill advancement speed. Therefore, a failure such as hole positional shifts or irregularities on the internal wall of the hole hardly occurs. In addition, the wear and tear of the drill is small in amount, and therefore, the dill can be used over a more extended period, and the degradation of the precision of the drilled hole does not occur.

The torsion angle indicates an angle at which a body forming a drill and a groove cross each other. That is, this angle denotes an angle formed by a leading edge and a straight line parallel to a drill axis passing through one point on this edge.

A groove in the body section is intended to discharge shavings from the board or the like, and it is desirable that a distal end angle of a distal end blade portion be in the range of 110 degrees to 150 degrees.

As long as the distal end angle is in the above range, a positional shift hardly occurs, and a desired shape of a hole to be formed is obtained. Even if an opening is drilled while a cupper plated laminate board is laminated in plurality, the openings are formed at the same position and in the same shape on both of the upper side cupper plated laminate board and the lower side cupper plated laminate board.

In addition, even if the use frequency of the drill is increased, electrical connectivity or reliability of a through hole is hardly lowered.

If the distal end angle of the distal end blade portion is less than 110 degrees, irregularities are easily formed on the internal wall of the drilled hole. If irregularities are subjected todesmear processing, such irregularities are further accelerated, thus increasing widths of the irregularities. When an electrical conductor layer is applied to the drilled hole to form a through hole, the thickness of the electric conductor layer may be fluctuated due to such irregularities. Therefore, electrical characteristics (such as impedance or through hole internal resistance value) are lowered.

In addition, if the distal end angle of the distal end blade portion exceeds 150 degrees, a drilled hole is easily displaced from a desired position. In particular, when a cupper plated laminate board is laminated in plurality, tendency of a positional shift further remarkably appears on the lower cupper plated laminate board. Therefore, when a hole has been formed as a through hole, electrical connection with another conductor layer is lowered. In addition, if a reliability test is carried out, deterioration starts at an earlier stage.

It is more desirable that the distal end angle of the distal end blade portion be in the range between 120 degrees and 140 degrees. This is because, in this range, a hole deformation or positional shift hardly occurs, in particular.

The distal end angle of the blade portion indicates an angle of a gap in which, when a drill is viewed from the distal end, there is no metal portion formed of one blade. This denotes an angle when a cutting blade has been projected in parallel to a face parallel to the drilling axis.

It is desirable that an angle of a second release angle of a distal end blade portion be in the range of 30 degrees to 50 degrees.

As shown in FIG. 2 (A), a distal end release face of a drill according to the present invention is formed in a multi-staged face shape composed of a plurality of flat release faces. First to fourth release faces that are flat faces from the cutting blade to the drill rotation direction are sequentially disposed along a peripheral direction. Among them, it is desirable that a release angle of the second release face (an angle formed by an axially vertical cross section and a release face at an outer periphery corner) be set in the range of 30 degrees to 50 degrees.

In a drill, it is desirable that a distal end outer diameter of a blade portion be equal to or smaller than 350 microns.

Having that diameter has an advantage that hole position precision is easily improved, and the drilled hole is formed in a desired shape. Thus, the lowering of electrical connectivity or reliability hardly occurs.

Conversely, if the distal end outer diameter exceeds 350 microns, the shavings to be discharged are increased in size, and thus, the drilled hole position precision is hardly improved. If the outer diameter is equal to or smaller than 50 microns, the drill easily breaks, and laser processing has an advantage. Here, it is desirable that the drill diameter be in the range of 50 microns to 350 microns. In particular, it is preferable that the diameter be in the range of 75 microns to 300 microns.

In addition, in a drill equal to or smaller than 100 microns in diameter, drill breakage easily occurs due to even small use frequency, depending on a processing condition. In this case, total thickness at the time of processing is reduced in accordance with a technique of decreasing the thickness of an insulation layer of a board to be processed or decreasing the laminate number of boards, thereby making it possible to enhance a use frequency while ensuring the hole position precision as described above.

In a so-called undercut drill, a neck narrowed in a cylindrical shape is formed in a body. A portion from a distal end of this blade portion to the neck is referred to as a margin portion. It is desirable that a shaving discharge groove formed in the body be defined at the inside with respect to the end of this margin portion. That is, it is preferable that the shaving discharge groove should not contact to the neck. In particular, it is desirable that the distance be at the inside by 100 microns or more from the end. In this manner, the discharge of shavings can be properly carried out, and a stress is not applied. Thus, the degradation of the hole position precision or the shape of a hole to be formed does not occur.

A length of a margin portion indicates a distance from a distal end to a neck, i.e., a length obtained by subtracting a length of the neck from a full length of a body. It is desirable that the margin portion be in the range of 0.1 mm to 0.3 mm in length. In particular, in the case where the distal end outer diameter of a drill is equal to or smaller than 200 microns, it is more desirable that the length of the margin portion is in the range of 0.1 mm to 0.3 mm.

If the length of the margin portion is less than 0.1 mm, a region formed by a groove for discharging shavings is reduced, and thus, a stress is easily applied to a drill. Therefore, the stress cannot be buffered, thus increasing a frequency of an occurrence of drill bending or breakage and the like. In addition, the hole position precision may be lowered.

If the length of the margin portion exceeds 0.3 mm, hole position precision is lowered.

An undercut type equipped with a neck is suitable to form a small diameter hole. Namely, a hole equal to or smaller than 400 microns can be drilled. Further, it is preferable to drill a hole equal to or smaller than 200 microns, in particular.

However, in such an undercut type, if one groove for discharging shavings is formed, the shavings may be hardly discharged.

Namely, if a position at which the groove is formed contacts to the neck, the shavings are hardly discharged. Thus, an excessive stress is applied to a drill per se. Therefore, the position precision or the lowering of the shape of a hole to be formed easily occurs.

In the present invention, a drill having a groove formed in a one-stripe shape at a distal end blade portion and at a body in order to form an opening while a work piece is rotated, wherein an occupying rate of a metal at a proximal end of a blade tip of the body is in the range of 40% to 80%, and a curvature radius in an axially vertical direction of a deepest portion of a groove at the proximal end is in the range of 1.50 mm to 3.50 mm. The distal end diameter of the drill may be equal to or smaller than 300 microns.

In the present invention, there is provided a printed wiring board manufacturing method for forming a hole that penetrates through a board having an electric conductor layer and forming the electric conductor layer in the hole to make electrical connection, the print wiring board manufacturing method comprising the steps A) to C) of:

A) forming a hole that penetrates through the board with a drill featured in that a blade portion is formed at a distal end and a groove is formed by one stripe on the body, and an occupying rate of a metal at a proximal end of the blade portion of the body is in the range of 40% to 80%;

B) forming an electric conductor layer in a hole; and

C) forming an electric conductor circuit on a top layer of the board.

Following the above step A), it is desirable to incorporate the desmear step.

In addition, it is desirable that the distal end diameter of a drill in the step (A) be equal to or smaller than 300 microns.

As a result of an utmost study of the Inventor et al, it was found that two problems occur when a drill diameter is reduced in size. One problem is associated with strength of the drill per se and the other problem is associated with discharge property of shavings. By overcoming these two problems, even if the drill diameter is small in size, an opening of a board is ensured, and, as a result, electric connectivity or reliability of the resultant printed wiring board is hardly lowered.

In a drill, a blade portion is formed at a distal end thereof, and a groove portion is formed at a body thereof. The distal end blade portion is rotated, thereby cutting a metal layer such as a copper foil and a resin impregnated with a core material such as a glass/epoxy resin configuring a board, and then, providing an opening on the board while shavings are formed. In the body, a groove portion formed in a helical shape is formed, and the shavings of the board that are shaped materials are discharged by means of the distal end blade portion.

If the diameter of the drill becomes small in size, the body is reduced in thickness, and thus, there is a concern that the strength is lowered. Hole forming is precluded due to damage to a drill, and thus, electrical connectivity or reliability has been lowered in a through hole having a conductor layer formed thereon. If a rate of the groove portion is lowered and a rate of a core portion is increased in order to ensure the strength of the drill, the discharge property of shavings may be lowered. Therefore, a desired opening shape cannot be formed on the board, and hole forming is precluded. Accordingly, in a through hole having an electric conductor layer formed thereon, electrical connectivity or reliability has been occasionally lowered due to a factor such as the presence of clogged shavings.

In addition, with respect to the tendency of these failures, when the use frequency of a drill becomes high, a phenomenon that electric connectivity or reliability is lowered further remarkably due to a factor such as drill wear and tear has easily occurred. As a result, hole forming is precluded; even if an electric conductor layer has been formed in a hole, it lacks electric connection stability; or an amount of hole positional shift increases, thereby causing a positional shift in forming a pattern of an electric conductor circuit in the post-processing step.

As a result, electric connection or reliability has been occasionally lowered. In particular, when a reliability test has been carried out under a heat cycle condition, opened-circuit or short-circuit has occasionally occurred at the number of cycles at an earlier stage, depending on the use frequency of the drill.

In drilling using a drill, in order to enhance drilling efficiency, a plurality of boards, for example, two or more boards are laminated on each other, and the boards at the same site are drilled at the same time. At the time of drilling, it is desired that the boards be drilled at the same position and in the same shape, without dependency on the drilling shape or position precision regardless of the number of sheets. However, in the case of a small diameter drill, the drilled holes have not been occasionally formed at the same position and in the same shape. In particular, a positional shift on a board positioned at the bottom of the boards becomes large. Further, when the use frequency becomes high, there has been an increasing tendency that the drilled holes are not formed at the same position and in the same shape. Therefore, depending on the board, electrical connectivity or reliability has been occasionally easily lowered.

In order to form an opening while drilling a work piece, in a drill featured in that a blade portion has been formed at a distal end and a groove has been formed in a body, the strength of the drill is improved, and the discharge property of shavings is not precluded by using the drill featured in that an occupying rate of a metal in cross section of a proximal end of a blade tip of the body is in the range of 40% to 80% and a curvature radius relevant to an axial vertical direction of the deepest portion of a groove at the proximal end is in the range of 1.50 mm to 3.50 mm. If a through hole is provided on the board formed by the drill, a hole shape failure or a positional shift hardly occurs, and electrical connectivity and reliability are hardly lowered.

In addition, in the drill of the present application, smears are formed to be lesser than those in a conventional drill. Therefore, desmear processing can be carried out within a short period of time. This is because a desired drilling shape and discharge property of shavings are improved at the time of drilling, thus reducing the degree of forming smears. Therefore, deformation of a through hole due to a desmear process (forming of irregularities or waving due to excessive smear removal) can be prevented, and the forming of a plating film of an electric conductor layer is hardly precluded.

By being a drill featured in that an occupying rate of a metal in cross section at a proximal end of a blade tip of a drill body is in the range of 40% to 80%, the discharge property of shavings is improved; hole forming is hardly precluded; and then, holes are easily formed in the same shape. Therefore, even if an electric conductor layer has been formed on a through hole formed on a board due to drilling, disconnection of the electric conductor layer hardly occurs. Thus, electric connectivity or reliability is hardly lowered.

In a drill featured in that an occupying rate of a metal in cross section at a proximal end of a blade tip of a body is in the range of 40% to 80%, the strength of the drill per se can be ensured; damage to the drill (including damage to the drill that suddenly occurs) hardly occurs, and hole forming is hardly precluded. Therefore, while a drill is used during a desired number of shots (the desired number of shots denotes a predetermined number of shots when a drilled through hole is formed in accordance with the predetermined number of shots, and subsequently, the drill is exchanged to form the through hole), damage to the drill hardly occurs when a through hole is formed on a board with a usual drill device. As a result, a through hole is not precluded from being formed on the board, and electrical connectivity and reliability are hardly lowered regardless of the number of shots.

Even if a through hole has been formed by means of a drill of the present application while a plurality of boards, for example, two or more boards are laminated on each other, a hole forming failure and a hole positional shift hardly occur. In this case, the hole forming failure and the positional shift hardly occur regardless of a location in which the boards are laminated on each other. As a result, even if an electric conductor circuit has been formed on the board, a connection failure or the like between (a land including) an electric conductor circuit and a through hole hardly occurs. As a result, electrical connectivity and reliability are hardly lowered.

In addition, even if the drill use frequency (that denotes that through holes are repeatedly formed on substrates by means of the same drill over 2000 drill shots or more, for example) becomes high, causing the wear and tear of the drill or the like, damage to the drill hardly occurs. In other words, the opening shape and positional shift of the board hardly occurs. As a result, electrical connectivity and reliability is hardly lowered.

Further, even if a drill diameter is reduced in size (in particular, even if the drill diameter is reduced to be equal to or smaller than 300 microns), hole forming is hardly precluded and a positional shift hardly occurs similarly. In particular, when a reliability test has been carried out under a heat cycle condition, functional lowering caused by disconnection or the like is hardly accelerated regardless of a drill use frequency, a drilling condition, and a drill diameter.

In particular, in a drill diameter equal to or smaller than 150 microns, there occurs a case in which the degree of damage to a drill significantly appears. Thus, in a small diameter drill, it was found that there are improved an advantage at an occupying rate of a metal at a proximal end of a blade tip of a drill body, the discharge property of shavings, and damage to a drill.

If the occupying rate of a metal in cross section at a proximal end of a blade tip of a drill body is less than 40%, the discharge property of the shavings is lowered. Therefore, the shavings are easily clogged in the groove, whereby, when drilling has been done on the board, irregularities or deformations are likely to occur on an internal wall of a through hole. As a result, if an electric conductor is applied into the through hole, the thickness of the electric conductor layer is hardly uniformed. Therefore, at a portion at which the electrical conductor layer becomes thin, disconnection is likely to occur, and then, electric connectivity and reliability are lowered. In addition, the degree of forming smears may be increased.

If an occupying rate of a metal in cross section at a proximal end of a blade tip of a drill body exceeds 80%, the strength of a drill per se is lowered, and then, damage to the drill is likely to occur when a through hole is formed on a board. In addition, damage to the drill is likely to occur before a desired number of shots has been reached, and deformation of the through hole is likely to occur if drilling is carried out on the board in that state. As a result, if an electric conductor layer is applied into the through hole, the thickness of the electric conductor layer is hardly uniformed. Therefore, at a portion at which the electric conductor layer becomes thin, shirt-circuit or the like is likely to occur, and electrical connectivity and reliability may be lowered.

In particular, it is desirable that an occupying rate of a metal in cross section at a proximal end of a blade tip of a body be in the range of 40% to 80%. As a result of further utmost study of the Investor et al, it was found that damage to a drill is likely to occur at a distal end. Therefore, being the occupying rate of the metal ensures discharge of the shavings formed at the distal end and the drill strength, and thus, damage to the drill hardly occurs. Further, assuming that a groove is formed in one stripe (one discharge groove is provided with respect to a drill), the occupying rate of the metal is in the range of 40% to 80% at its distal end. Thus, even if the diameter is reduced in size (this downsizing in diameter denotes that the drill diameter is equal to or smaller than 300 microns, in particular, that the drill diameter is equal to or smaller than 150 microns), the shape of a drilled through hole is maintained, and the drill per se is hardly damaged.

A description will be given with respect to an occupying rate of a metal of a drill.

On a face formed by cutting a cross section of a proximal end of a blade tip of the drill, a metal formed in a round rod shape free from groove, as shown in FIG. 21 (A) is obtained as an occupying rate of 100%. Then, a metal occupying rate of the drill is defined by subtracting therefrom an area ratio at which the metal in the region formed of a groove portion has been cut. In general, a depth or width of the groove is substantially uniform, and thus, it is recognized that the occupying rate of metal in cross section is constant at a proximal end of a blade tip and a body center portion.

Drill of one-stripe groove type (refer to FIG. 21 (B))
Metal ratio forming center portion: 100%
Ratio at which groove portion is formed: X %
Metal occupying rate of one-stripe type=100%−X %=A' %

In addition, by being a drill featured in that a curvature radius in an axially vertical direction of the deepest portion of a groove at a proximal end of a blade tip is in the range of 1.50 mm to 3.50 mm, the discharge property of shavings is improved; hole forming is hardly precluded, and the holes are easily formed in the same shape. Namely, by means of the distal end blade tip, a cut resin can be smoothly discharged in the groove, and the rotation of drill is not precluded. Thus, an opening is formed on a board in a desired shape. Therefore, even if an electric conductor layer is formed at a through hole formed on the board by means of a drill, disconnection of the electric conductor layer or the like hardly occurs, and thus, electric connectivity and reliability are hardly lowered. The deepest portion denotes a point P that is the closest to an axis center CC of the groove 20, as shown in FIG. 22 (A), FIG. 22 (B), and FIG. 22 (C).

In a drill featured in that a curvature radius in an axially vertical direction of the deepest portion of a groove at a proximal end of a blade tip is less than 1.50, the shavings formed at the distal end blade is hardly discharged smoothly in the groove. Thus, the shavings are easily clogged in the groove, and damage to the drill easily occurs. As a result, a shape failure or a positional shift of an drilled through hole hardly occurs. Electrical connectivity and reliability are easily lowered. In addition, if the drill use frequency increases or if the drill diameter is reduced in size, further, the shavings are easily clogged in the groove, and the clogging failure is likely to appear.

In a drill featured in that a curvature radius in an axially vertical direction of the deepest portion of a groove at a proximal end of a blade tip exceeds 3.50 mm, shavings are likely to wobble at a discharge portion depending on the rotation frequency at the time of discharge of the shavings. Thus, the center axis of the drill may be displaced, and such displacement may cause a positional shift of the hole. Therefore, electric connectivity and reliability have been occasionally lowered.

In addition, in a drill featured in that a curvature radius exceeds 3.50 microns, a distal end portion of a groove more easily arrives at the vicinity of a center portion of the groove. As a result, the strength of the drill per se is easily lowered; damage to the drill easily occurs; and a shape failure or a positional shift of a through hole to be drilled easily occurs. Thus, electrical connectivity and reliability are easily lowered. In particular, if the use frequency of the drill increases or if the drill is reduced in diameter, the above failure is likely to occur.

With reference to FIG. 22 (A), a description will be given with respect to a curvature radius of a groove portion.

When a drill cut cross section is seen, an inverse value of the curvature is taken to numerically represent its face in the curvature in the deepest portion P of the groove 20, and the inverse number has been represented as a curvature radius.

$$\Delta S = R \Delta \theta \quad (1)$$

ΔS: This indicates a length from P to P'.
Δθ: This indicates an angle between CP and CP'.
From the equation (1), R=ΔS/Δθ is established.

In a drill featured in that an occupying rate of a metal in cross section of a proximal end of a blade tip of a drill is in the range of 40% to 80%, and a curvature radium in an axially vertical direction of the deepest portion of a groove at a proximal end of the blade tip is in the range of 1.50 mm to 3.50 mm, even if the rotation frequency is set to be equal to or greater than 300 Krpm, damage to the drill hardly occurs, and then, shavings can be properly discharged. Namely, the reliability of an opening during processing can be enhanced. In addition, in other words, an opening can be drilled by means of a drill even at a high speed rotation, and then, the number of openings in single processing time can be increased, making it possible to enhance productivity.

A groove of a body may be the deepest at a distal end portion that is a proximal end of a blade tip; the groove may be shallow as it is distant from the distal end portion; or the depths of all the grooves may be equal to each other. The groove should be shallow in consideration of the discharge property and strength of shavings.

It is desirable that a metal forming a drill be composed of any of: tungsten carbide, a metal inevitably containing Co of 3 to 10 wt % and the residual tungsten carbide; and metal C. These metals is high in hardness, and thus, even if the groove has been formed at a desired ratio, the missing or the like at the time of processing hardly occurs, and the desired metal occupying ratio and the groove curvature radius of the present invention can be formed.

Even if the boards are laminated on each other, and then, a through hole is formed, the axis in rotation becomes uniform, and thus, damage to the drill is reduced, and a positional shift is reduced. Therefore, the problem at the time of formation hardly occurs, and thus, electrical connectivity and reliability are hardly lowered.

In addition, even if the use frequency of the drill becomes high, the wear and tear of the drill is also reduced. Thus, in a drill having a desired metal occupying rate or a groove curvature radius of the present invention, there are a few cases in which an opening deviates greatly from a set value until the desired drill use frequency has been obtained. Thus, a through hole formed on the board hardly causes a shape failure or a positional shift. Therefore, electrical connectivity and reliability are hardly lowered.

In addition, in a re-ground drill as well, an occupying rate of a metal of the drill is in the range of 40% to 80%, and a curvature radius in an axially vertical direction of the deepest portion of a groove at a proximal end of a blade tip is in the range of 1.50 mm to 3.50 mm, whereby it was found that the opening property of the board is maintained, and a positional shift is prevented in a similar manner to that of a new drill.

In a conventional drill, if a distal end diameter of the drill is equal to or smaller than 300 microns, the strength of the drill has not been successfully maintained or a problem with discharge of shavings has been likely to occur.

With a drill according to the present application, featured in that an occupying rate of a metal of the drill is in the range of 40% to 80% and a curvature radius of a distal end portion of a groove of a body is in the range of 1.50 mm to 3.50 mm, these problems hardly occur. Therefore, a small diameter through hole can be formed and then, electrical connectivity and reliability are easily obtained. In addition, even if gaps (pitches) of the adjacent through holes are smaller than conventional, a forming failure caused by a drill (for example, this failure denotes that a formed through hole is displaced more significantly than a designed value, such as positional shift or unstable pitch distance), thus making it possible to obtain a board having its high density and fine pitches.

In the present invention, a printed wiring board manufacturing method for forming a hole penetrating through a board having an electric conductor layer and forming the electric conductor layer in the hole to make electrical connection, the method comprising:

A) forming a hole that penetrates through the board in accordance with a drill featured in that a blade portion is formed at a distal end and a groove is formed by one stripe, and an occupying rate of a metal at a proximal end of the blade tip of the body is in the range of 40% to 80%; and a curvature radius in an axially vertical direction of a deepest portion of the groove is in the range of 1.50 to 3.50 mm;

B) forming an electric conductor layer in a hole; and

C) forming an electric conductor circuit on a top layer of the board.

Following the above step A), it is desirable to include a desmear step.

desmear can be carried out in accordance with either of a wet typedesmear (desmear processing carried out by immersion using a chemical such as an acid or an oxidizing agent) or a dry type desmear (oxygen and nitrogen plasma processing or corona processing). In these processes as well, desmear is reliably carried out within a short period of time, as compared with a conventional drill. Therefore, the drilled through hole can be prevented from being deformed due to the step other than the drilling step, i.e., due to the desmear step.

It is desirable that the distal end diameter of the drill in the step A) be equal to or greater than 300 microns. In a drill according to the present application, featured in that an occupying rate of a metal in cross section of a proximal end of a blade tip is in the range of 40% to 80% and a curvature radius in an axially vertical direction of the deepest portion of a groove at a proximal end of the blade tip is in the range of 1.50 mm to 3.50 mm, these problems hardly occurs. Therefore, a small diameter through hole can be formed and then, electrical connectivity and reliability are easily obtained. In addition, even if gaps (pitches) of the adjacent through holes are smaller than conventional, a forming failure caused by a drill (for example, this failure denotes that a formed through hole is displaced more significantly than a designed value, such as positional shift or unstable pitch distance), thus making it possible to obtain a board having its high density and fine pitches.

A positional shift of a drilled through hole is reduced using a drill featured in that a torsion angle of a drill groove is in the range of 30 degrees to 50 degrees. In other words, the hole forming precision is improved. In addition, the shavings of the drill are properly discharged, thus making it possible to obtain a printed wiring board having its excellent electrical connectivity and reliability because the shavings do not preclude at the time of drilling. In addition, the wear and tear of the drill due to the use frequency can be restricted, thus making it possible to increase the use frequency more significantly than conventional, and then, the precision and shape of a hole to be drilled is hardly lowered.

If shavings interfere at the time of drilling, a positional shift of a hole occurs, and then, irregularities are formed on an internal wall of the hole. Therefore, the lowering of electrical connectivity and reliability may occur. Shavings are likely to apply excessive stress to the drill, and thus, the wear and tear of the drill is accelerated.

In the case where a torsion angle is less than 30 degrees or in the case where a torsion angle exceeds 50 degrees, shavings are hardly discharged. Therefore, the shaving causes a positional shift of the hole because they preclude drilling, and irregularities are formed on the internal wall of the hole. Thus, electrical connectivity and reliability are lowered. The wear and tear of the drill is easily accelerated due to the shavings that are hardly discharged. Therefore, the drill deteriorates at an earlier use frequency.

It is further desirable that a torsion angle is in the range of 35 degrees to 45 degrees. In this range, shavings are efficiently discharged regardless of a drilling condition such as a rotation frequency or a drill advancement speed. Therefore, a failure such as a positional shift of the hole or irregularities on the internal wall of the hole hardly occurs. In addition, the wear and tear of the drill is reduced, and thus, the drill can be used for a longer period. The drilled hole does not lower precision or the like.

A torsion angle indicates an angle at which a body forming a drill and a groove cross. That is, this torsion angle denotes an angle formed by a leading edge and a straight line parallel to a drill axis passing through one point on the edge.

It is desirable that a distal end angle of a blade portion of a distal end of a drill be in the range of 110 degrees to 150 degrees.

As long as the distal end angle is in the above range, a positional shift hardly occurs, and a hole is formed in a desired shape. Even if drilling has been carried while boards are laminated in plurality, the holes are vertically formed similarly in the same shape. In addition, electrical connectivity and reliability is hardly lowered due to the use frequency of the drill.

If the distal end angle of the distal end blade portion is less than 110 degrees, irregularities are easily formed on the internal wall of the drilled hole. If irregularities are subjected to desmear processing, such irregularities are further accelerated, and thus, the irregularities increases. After an electric conductor layer is applied to the drilled hole, when a through hole is formed, a thickness of the electric conductor layer fluctuates due to the irregularities. Therefore, electrical characteristics (such as impedance and through hole internal resistance value) are lowered.

In addition, if the distal end angle of the distal end blade portion exceeds 150 degrees, the drilled hole is easily shifted from a desired position. In particular, when the boards are laminated each other in plurality, tendency of the positional shift further significantly appears. Therefore, when a hole has been formed as a through hole, electrical connection with another electric conductor layer is lowered. In addition, when a reliability test is carried out, deterioration starts at an earlier stage.

It is more desirable that the distal end angle of the distal end blade portion be in the range between 120 degrees and 140 degrees. In this range, even if an angle fluctuation has occurred, a hole deformation or a positional shift hardly occurs.

The distal end angle of the blade portion indicates an angle of a gap at which, when a drill is seen from a distal end, a metal portion formed by one blade is absent. This angle denotes an angle when a cutting blade is projected in parallel to a face parallel to the axis of the drill.

It is desirable that an angle of a second release angle of a distal end blade portion be in the range of 30 degrees to 50 degrees.

As shown in FIG. 19 (A), a distal end release face of a drill according to the present invention is formed in a multi-staged face shape composed of a plurality of flat release faces, and then, first to fourth release faces that are flat faces from the cutting blade to the drill rotation direction are sequentially disposed along a peripheral direction. Among them, it is desirable to set a release angle of the second release face (an angle formed by an axially vertical cross section and a release face at the outer periphery corner) in the range of 30 degrees to 50 degrees.

It is desirable that a diameter of the body be equal to or smaller than 300 microns.

Being that diameter has an advantage that hole position precision is easily improved and a hole is formed in a desired shape, and thus, the lowering of electrical connectivity and reliability hardly occurs.

In particular, when using a drill having low rigidity and a diameter equal to or smaller than 150 microns, the metal occupying rate and groove curvature of the present application is set, thereby making it possible to enhance the use frequency. The lowering of electrical connectivity and reliability hardly occurs.

In a so-called undercut drill, a neck narrowed in a cylindrical shape in a body may be formed. A portion from a distal end of this blade portion to the neck is referred to as a margin portion. It is desirable that a shaving discharge groove formed in the body be at the inside with respect to an end of this margin portion. That is, it is preferable that the shaving discharge groove should not contact to the neck. In particular, it is desirable that the distance be present at the inside by 100 microns or more from an end part. In this manner, the shavings can be properly discharged, and a stress is not applied, and thus, the lowering of the hole position precision and the shape of a hole formed does not occur.

A length of the margin portion indicates a distance from a distal end to a neck, i.e., a length obtained by subtracting a length of the neck from a length of the body. It is desirable that the length of the margin portion be in the range of 0.1 mm to 0.3 mm. In particular, in the case where the distal end outer diameter of the drill is equal to or smaller than 200 microns, it is more desirable that the length of the margin portion be in the range of 0.1 mm to 0.3 mm.

If the length of the margin portion is less than 0.1 mm, a region formed by a groove for discharging shavings is reduced, and thus, a stress is easily applied to a drill. Thus, the stress cannot be buffered, and therefore, an occurrence frequency of drill bending or break and the like increases. In addition, the hole position precision is occasionally lowered.

If the length of the margin portion exceeds 0.3 mm, the hole position precision is lowered.

An undercut type equipped with a neck is suitable to form a small diameter hole. Namely, a hole equal to or smaller than 400 microns can be drilled. Further, it is preferable to drill a hole equal to or smaller than 200 microns, in particular.

While the above description of the drill is given with respect to a drill of one groove type relevant to a groove, similar advantageous effect can be attained with respect to a drill of two-groove type.

As shown in FIG. 36, a processing device 100 for drilling a printed wiring board in the present application is equipped with an X-Y table 90 for placing a copper-plated laminate board or a multi-layered printed wiring board 60. The X-Y table 90 is equipped with a table drive mechanism 114 that can move to axes X and Y, respectively. In addition, the X-Y table is equipped with a spindle mechanism 106 for rotating a drill 10 and a spindle drive mechanism 112 for driving the spindle mechanism 106. A drill discharge groove formed in one stripe is fixed to each of these spindles 106, and a penetration opening 66 is provided on a printed wiring board 60 at a rotation speed/drilling feed speed. It is desirable that these rotation speeds be at least 100 Kprm. What is more desirable is equal to or greater than 200 Kprm.

These table drive mechanism 114 and spindle drive mechanism 112 each carry out alignment of a precise position for driving or drilling in accordance with a timing of drilling using a drill. Interlocking with a computer 110 that precisely controls these drive mechanisms is made. Processing data 108 is inputted to the computer 110.

A material for the X-Y table 90 can be used as that generally used for a processing device. It is more desirable to use a material that is hardly affected by a heat at the time of processing. The board 60 placed on the X-Y table 90 may be one or may be subjected to drilling processing while a plurality of boards, for example, two or more boards are laminated on each other (for example, four boards are laminated on each other as such an example.) The number of boards is properly adjusted in accordance with a drill, boards, and the shape of a hole to be drilled.

In addition, it is desirable that a feed speed of these drills be at least 30 inches per minute. It is more desirable that the speed be equal to or greater than 40 inches per minute. Productivity is ensured, and the opening shape of the board is stabilized by the rotation speed and feed speed described previously. Namely, board connectivity and reliability is hardly lowered.

As a drill 10 used for this spindle mechanism 106, it is desirable to use a drill of which a torsion angle of a discharge groove formed in one stripe in a body be in the range of 30 degrees to 50 degrees. Thus, shavings are efficiently discharged. In addition, even if a plurality of boards are laminated on each other, a failure with forming a hole hardly occurs.

As a drill 10 used for this spindle mechanism 106, it is desirable to use a drill in which a groove is formed in one stripe in the distal end blade portion and body, the metal occupying rate at the proximal end of the blade tip of the body be in the range of 40% to 80%, and a curvature radius in an axially vertical direction of the deepest portion of a groove at the proximal end be in the range of 1.50 mm to 3.50 mm. This is because the property of discharging shavings and preclusion of forming holes are prevented by these drills. In addition, even if a plurality of boards are laminated, a failure with forming holes hardly occurs.

The spindle mechanism 106 adjusts a drill rotation speed, and then, the spindle drive mechanism 112 described previously properly precisely controls a feed speed of a drill, drill elevation, or drill movement and the like. Therefore, interlock with the computer 110 is made.

Drills may be used, each of which is equal to or smaller than 300 microns in diameter. By means of these drills, small diameter drilling can be carried out precisely.

The computer 110 that controls processing devices causes control of the X-Y table or spindle at the time of processing or drilling at a predetermined position, and occasionally, controls a drive timing of a mechanism of these processing devices.

The processing device 100 in the present application is equipped with: an X-Y table 90 for placing one or two or more drilling printed wiring board 60 to be laminated on each other; a spindle mechanism 106 equipped with a drill 10 having a groove formed in one stripe; a mechanism 112, 114 for driving the X-Y table 90 or spindle mechanism 106; and a computer 110 that controls driving and drilling positioning operations or the like.

As another mechanism, a mechanism for positioning a board is provided. This mechanisms include: a camera 102 for picking up as an image a positioning mark 61 on a board 60; an image processing unit 104 for image-processing an image picked up by the camera 102; and a computer 100 for calculating a position. A precise processing position is calculated in accordance with the position of the positioning mark 61, driving the X-Y table 90 and the spindle mechanism 106 or the like.

In addition, a mechanism for counting the number of drilling shots may be provided in order to grasp a drill exchange period. A temperature control unit may be provided in order to maintain the inside of the processing device at a constant temperature. In the processing device, it is desirable to provide an envelope in consideration of a safety aspect of preventing damage to a human body due to drill breakage or scattering of shavings or a manufacturing aspect of preventing entry of foreign matter such as dust or controlling a temperature.

Advantageous Effect

A drill according to the present invention has sufficient strength, has good discharge property of shavings, and does not preclude the discharge property of shavings. Drilled through holes are easily formed in the same shape, and then, a shape failure or a positional shift hardly occurs. Thus, electrical connectivity and reliability of a through hole formed in a through hole are hardly lowered. The remaining amount of smear is reduced due to improvement of the discharge property of shavings, thus making it possible to prevent deformation of a through hole due to desmear.

BRIEF DESCRIPTION OF THE DRAWINGS

FIG. 2 (A) is a front view when a distal end side of the drill shown in FIG. 1 is seen.

FIG. 2 (B) and FIG. 2 (C) are enlarged views each showing a distal end part of the drill.

FIG. 3 is an illustrative view illustrating the steps of manufacturing the drill.

FIG. 4 (B) is a side view showing a drill of an undercut type.

FIG. 6 is an illustrative view illustrating drilling of a through hole into a copper filed laminate board.

FIG. 7 is a chart showing an evaluation result of each of First Example 1 and First Reference Example 1.

FIG. 8 is a chart showing an evaluation result of each of First Example 2 and First Reference Example 2.

FIG. 9 is a chart showing an evaluation result of each of First Example 3 and First Reference Example 3.

FIG. 10 is a chart showing an evaluation result of each of First Example 4 and First Reference Example 4.

FIG. 11 is a chart showing an evaluation result of each of First Example 5 and First Reference Example 5.

FIG. 12 is a chart showing an evaluation result of each of First Example 6 and First Reference Example 6.

FIG. 13 is a chart showing an evaluation result of each of First Example 7 and First Reference Example 7.

FIG. 14 is a chart showing an evaluation result of each of First Example 8 and First Reference Example 8.

FIG. 15 is a chart showing an evaluation result of each of First Example 9 and First Reference Example 9.

FIG. 16 is a chart showing a break result of each of First Example 9 and First Reference Example 9.

FIG. 17 is a chart showing an evaluation result of Comparative Example 1.

FIG. 18 (A) is a side view showing a drill according to an embodiment of the present invention.

FIG. 18 (B) is a side view showing a drill of an undercut type.

FIG. 19 (B) is an enlarged view showing a distal end part of the drill.

FIG. 19 (C) is a sectional view taken along the line C-C.

FIG. 19 (D) is an enlarged view showing a distal end part of the drill.

FIG. 20 is an illustrative view illustrating the steps of manufacturing the drill.

FIG. 21 is an illustrative view illustrating an occupying rate of the drill according to the present invention.

FIG. 22 is an illustrative view illustrating the deepest portion of a drill groove according to the present invention.

FIG. 23 is a chart showing an evaluation result of each of Second Example 1 and Second Reference Example 1.

FIG. 24 is a chart showing an evaluation result of each of Second Example 2 and Second Reference Example 2.

FIG. 25 is a chart showing an evaluation result of each of Second Example 3 and Second Reference Example 3.

FIG. 26 is a chart showing an evaluation result of Second Modified Example 1.

FIG. 27 is a chart showing an evaluation result of Second Modified Example 2.

FIG. 28 is a chart showing an evaluation result of Second Modified Example 3.

FIG. 29 is a chart showing an evaluation result of Second Modified Example 4.

FIG. 30 is a chart showing an evaluation result of Second Modified Example 5.

FIG. 31 is a chart showing an evaluation result of each of Second Comparative Example 1 and Second Comparative Example 2.

FIG. 32 is a chart showing an evaluation result of the number of damage check shots of each of Second Examples 1 to Second Example 3 and Second Modified Example 1.

FIG. 33 is a chart showing an Example of the number of damage check shots of each of Second Modified Examples 1 to Second Modified Example 4.

FIG. 34 is a chart showing an Example of the number of damage check shots of each of Second Modified Examples 5, Second Modified Example 1, and Second Comparative Example 2.

BEST MODE FOR CARRYING OUT THE INVENTION

First Example

Figure 1:
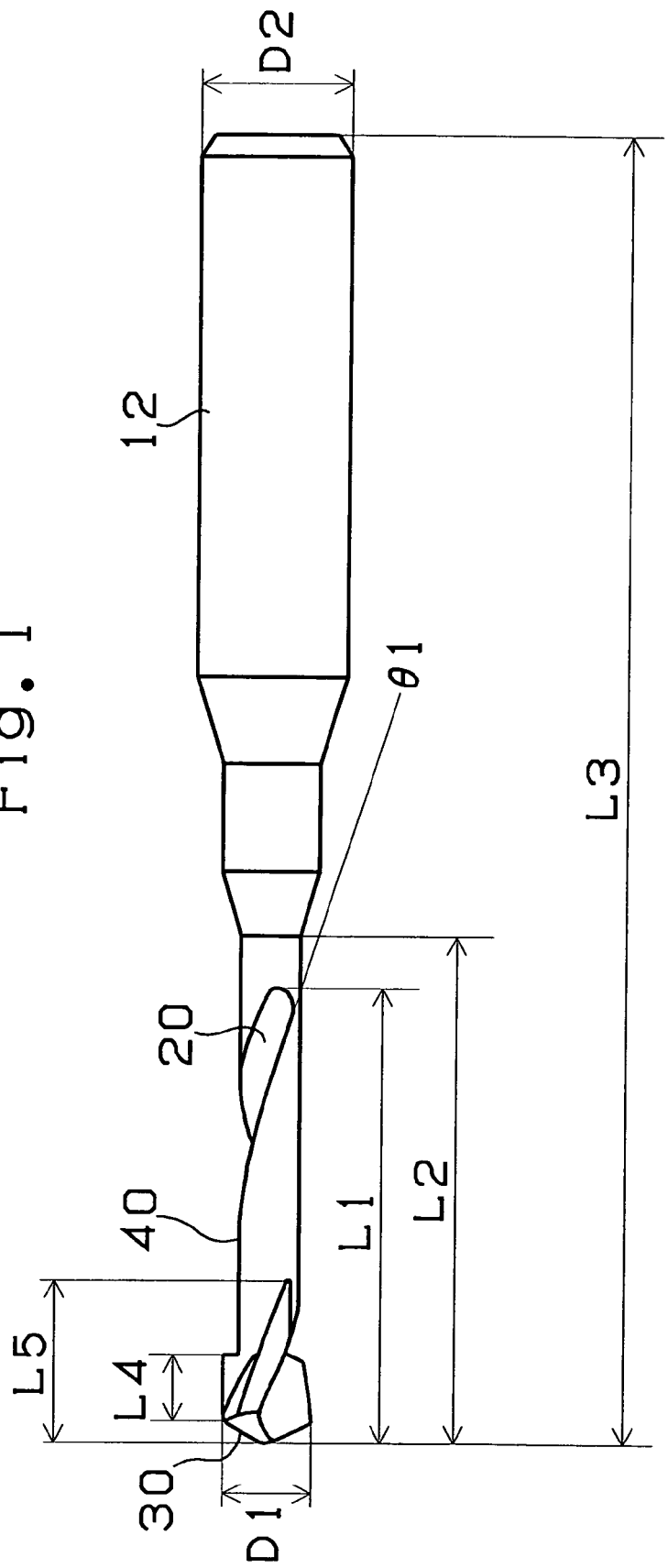
FIG. 1 is a side view showing a drill according to an embodiment of the present invention.

Now, a first example of the present invention will be described with reference to the accompanying drawings.
(Drill)

First, the steps of manufacturing a drill according to the first embodiment will be described with reference to FIG. 3.

1. Preparing Material for Drill

Metals for use in the drill according to the present invention include alloys including iron, cobalt, and nickel or the like. A column 50 including these metals is prepared so as to be equal to or greater than a diameter of a shank of a drill (FIG. 3 (A)). It is more desirable to use a super-hard alloy.

2. Drill Processing

In the prepared column 50, grinding is carried out in order to form a body 40 of a drill (FIG. 3 (B)). Namely, grinding is carried out until a desired distal end outer diameter has been obtained. In this manner, a shank 12 and the body 40 of the drill are configured. At this time, in the body, a drill may be formed in an undercut shape by forming a neck (a portion narrowed in a cylindrical shape) at a portion for the body, as preferred.

Next, in the body 40 of the drill, a shaving discharge groove 20 for shaving discharge is formed in e helical shape (FIG. 3 (C)). The groove 20 is formed of one stripe. At this time, a torsion angle of a crossing point between the groove 20 and the body 40 is formed in a desired shape. At this time, it is desired to set the angle in the range of 30 degrees to 50 degrees. At this time, a gap between the grooves 20 and 20 may be uniform or the gap between the grooves may be gradually changed. This gap is properly determined depending on a drilling diameter and a material or the like for drilling.

Next, a blade portion 30 that is a distal end part of the drill is processed (FIG. 3 (D)). Although the processing sequence is not limited in particular, a first angle and a second release angle forming the blade portion are processed, and then, each of the groove portions is processed to be ground. Then, a respective portion called a release angle is processed in a planer shape or in a conical shape and the like. In this manner, a drill of one blade consisting of the blade portion 30, the body 40, and the shank 12 can be obtained such that a one-stripe shaving discharge groove 20 for discharging shavings has been formed at the body 40.

FIG. 1 is a side view showing a drill 10; FIG. 2 (A) is a front view when a distal end side of the drill is seen; and FIG. 2 (B) and FIG. 2 (C) are enlarged views each showing a distal end part of the drill.

As shown in FIG. 1, a distal end diameter D1 of the blade portion 30 of the drill 10 is set to 0.115 mm and a diameter D2 of the shank 12 is set to 2 mm. A cutting blade length L1 is set to 1.8 mm; a body length L2 is set to 2.0 mm; a full length is set to 31.75 mm; a margin length L4 is set to 0.25 mm; and a relief length L5 is set to 1 mm. On the other hand, a torsion angle θ1 of the shaving discharge groove 20 is set to 40 degrees.

A groove width L6 shown in FIG. 2 (C) is set to 0.145 mm. A distal end angle θ2 shown in FIG. 2 (B) is set to 150 degrees.

As shown in FIG. 2 (A), a distal end release face of the drill is formed in a multi-staged face shape composed of a plurality of flat release faces. A first release face 32A, a second release face 32B, a third release face 32C, and a fourth release face 32D that are flat faces from the cutting blade 31 toward a drill rotation direction (in the counterclockwise direction shown in the figure) are sequentially disposed along a peripheral direction. In addition, an opposite side first release face 32E and an opposite side second release face 32F, which are also flat faces, are disposed in the vicinity of an axle. A second chamfer face 33 formed in a sectional arc shape is provided adjacent to the fourth release face 32D and the opposite side second release face 32F. A release angle of the first release face 32A is set to 10 degrees and a release angle of the second release face 32B is set to 40 degrees.

(Drill Processing Method of Printed Wiring Board)
1. Copper Foiled Laminate Board An insulation substrate opened by means of the drill according to the present invention can be used as long as it is obtained as an organic insulation substrate. Specifically, it is desirable that such insulation substrate be a rigid (hard) laminate substrate selected from an alamide non-woven cloth-epoxy resin substrate; a glass cloth epoxy resin substrate; an alamide non-woven cloth-polyimide substrate; a glass cloth bis maleimide triadine resin substrate; a glass cloth polyphenylene ether resin substrate, FR-4, and FR-5, or alternatively, a flexible substrate made of a polyethylene ether (PPE) film or polyimide (PI) film.

The thickness of the above insulation resin substrate is in the range of 10 microns to 800 microns, is preferably in the range of 20 microns to 400 microns, and is optimally in the range of 50 microns to 300 microns. This is because, if the thickness becomes smaller than these ranges, the rigidity is lowered, and the substrate is difficult to handle; and conversely, if the thickness is too large, a small diameter through hole and an electric conductor layer are difficult to form.

The thickness of a copper foil of an insulation substrate is in the range of 5 microns to 50 microns, is preferably in the range of 8 microns to 30 microns, and is further preferably in the range of 12 microns to 25 microns. This is because, when a small diameter through hole is provided in accordance with drill processing, if the thickness is too small, a pattern is precluded from being formed, and conversely, if the thickness is too large, a fine pattern is difficult to be formed in accordance with etching.

A one-sided or double-sided cupper plated laminate board of these substrates is prepared and used.

2. Processing Condition

In order to carry out processing using a drill 10, as shown in FIG. 6, an abutment board (bakelite board) 92 larger than a laminate board to be processed is placed on an X-Y table 90. Then, on the abutment board, one or more one-sided or double-sided cupper plated laminate boards 60 are laminated. Moreover, as preferred, on the cupper plated laminate board, a swelling agent is impregnated in acryl, and then, an entry sheet 94 is placed such that a metal layer such as aluminum has been provided in a top layer, whereby processing may be carried out. At the time of drilling, the swelling agent in the entry sheet 94 serves as a lubricating agent.

At this time, it is desirable to use a drill processing condition below.

Rotation frequency: 100 Krpm to 500 Krpm
Feed speed: 30 inches per minute to 200 inches per minute
Number of shots: 2000 shots or more Here, if the rotation frequency is less than 100 Krpm, processing cannot be efficiently carried out. On the other hand, if the rotation frequency exceeds 500 Krpm, a service life is reduced by drill heating.

If the feed speed is less than 30 inches per minute, processing cannot be efficiently carried out. On the other hand, the feed speed exceeds 200 microns per minute, a drill burden increases, and breakage easily occurs. In particular, it is desirable that the rotation frequency be in the range of 100 Krpm to 400 Krpm and the feed speed be in the range of 40 inches per minute to 120 inches per minute from the viewpoint of processing efficiency and drill service life.

On a drilled cupper plated laminate board, a through hole and a board having formed thereon a land and an electric conductor circuit of the through hole are formed in accordance with a subtractive process or a tenting technique.

Further, a board may be laminated in accordance with a press technique in order to form a multi-layered board or multi-layering may be carried out in accordance with an additive process while the board having the through hole formed thereon is used as a core board.

First Example 1

1. Preparing Material for Drill

A metal formed of an alloy such as tungsten, iron, and cobalt was prepared. The metal was prepared as having been adjusted to a diameter of a processing device for thickening the metal to be larger than a drill diameter to be circularly formed and for rotating a drill.

2. Drill Processing

First, a portion forming a body of a drill is processed. In this manner, a shank and a body of the drill are formed. At this time, a distal end outer diameter of a blade portion for the body is adjusted to a preset diameter. Then, a shaving discharge groove is formed in a one-stripe shape in order to discharge shavings. At this time, a torsion angle of the drill is set so as to be a predetermined angle.

Figure 4:
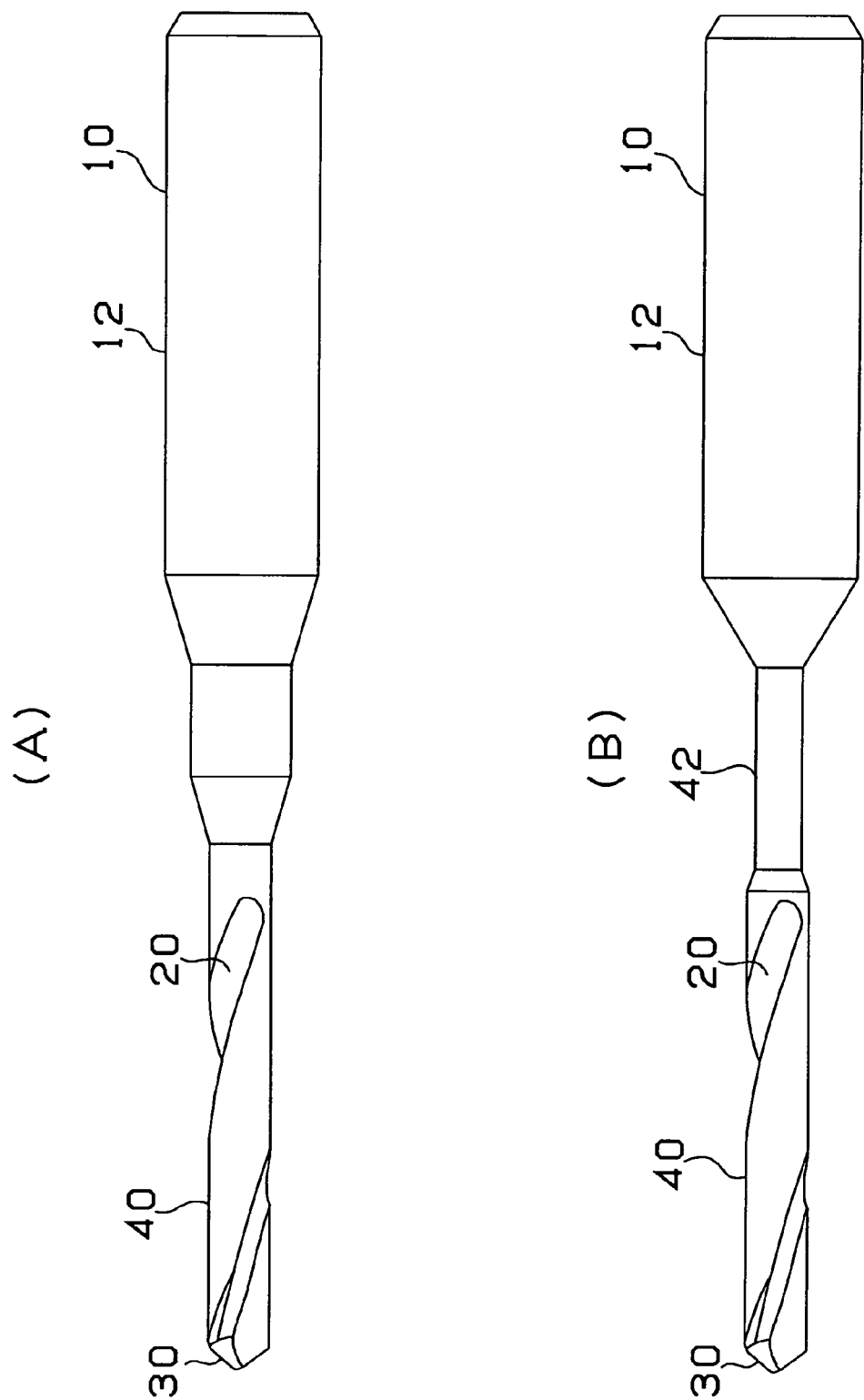
FIG. 4 (A) is a side view showing a drill of a straight type.

Then, a first angle and a second release angle was formed in order to form one blade, and then, the drills of First Example 1 and First Reference Example 1 shown below were produced through the steps or the like of forming a respective release angle. In First Example 1, as shown in FIG. 4 (A), a drill of straight type with no undercut was used.

TABLE 1

Table 1 List of items of First Example and First Reference Example 1

| Item | Torsion angle | Distal end angle of blade portion | Second release angle | Distal end outer diameter | Type |
|---|---|---|---|---|---|
| First Example 1-1 | 30 | 110 | 40 degree | 100 μm | Straight |
| First Example 1-2 | | 120 | 40 degree | 100 μm | Straight |
| First Example 1-3 | | 130 | 40 degree | 100 μm | Straight |
| First Example 1-4 | | 140 | 40 degree | 100 μm | Straight |
| First Example 1-5 | | 150 | 40 degree | 100 μm | Straight |
| First Reference Example 1-1 | | 90 | 40 degree | 100 μm | Straight |
| First Reference Example 1-2 | | 100 | 40 degree | 100 μm | Straight |
| First Reference Example 1-3 | | 160 | 40 degree | 100 μm | Straight |
| First Reference Example 1-4 | | 170 | 40 degree | 100 μm | Straight |

3. Drilling Processing of Drill (1) Drill Processing

Four double-sided copper plated laminate boards 60 shown in FIG. 5(A) (material: glass epoxy resin or polyimide resin: 200 microns in thickness of insulation layer 62; and 12 microns in thickness on one side of a copper foil 64) were laminated on an X-Y table 90 for drill processing of a drill processing device (available from Hitachi Via Co., Ltd. Model: ND-N series) as shown in FIG. 6. A disposal board (backup board) 92 was placed at the lower side of the double-sided copper plated laminate board 60. An entry sheet 94 for drill processing was placed at the upper side of the double-sided copper plated laminate board 60.

In that state, the drilling of a drilling diameter of 100 microns was carried out in the drill condition shown below. At this time, every time the four laminate boards were processed, the number of drilling shots was converted as one shot.

<Drill Processing Condition>

Rotation frequency: 160 Krpm
Feed speed: 40 inches per minute
Shape of use drill: Drill shown in Table 1
Number of evaluation shots: 3000 shots and 6000 shots In this manner, a through hole 66 having a drilling diameter of 100 microns was provided in the board 60 (refer to FIG. 5(B)).

After drill processing, a desmear processing was applied to the double-sided copper plated laminate board by means of a per manganese acid or the like.

4. Forming an Electric Conductor in a Through Hole

An electroless plating film 66 and an electrolytic plating film 68 were sequentially provided, and then, an electric conductor layer was formed on an internal wall of a through hole 66 and a top layer of a laminate board 60 (refer to FIG. 5(C)). At this time, the plating was carried out under the plating conditions below.

Electroless Plating

[Electrolytic Copper Plating Water Solution]

$NiSO_4$: 0.003 mol/l

Tartaric acid: 0.200 mol/l

Copper sulfate: 0.030 mol/l

NaOH: 0.050 mol/l a, a'-bipyridyl: 100 mg/l

Polyethylene glycol: 0.10 g/l

[Electroless Plating Condition]

Immersion was carried out at a liquid temperature 50° C. for 40 minutes.

Electrolytic Plating

[Electrolytic Copper Plating Water Solution]

Sulfuric acid: 160 g/l

Copper sulfate: 77 g/l

Additive (available from Atotech Japan, Product name: Copperacid GL): 1 ml/l

[Electrolytic Plating Condition]

Current density: 2 A/dm$^2$

Time: 30 minutes

Temperature: 25° C.

5. Forming Circuit

An electric conductor layer was formed, and then, an etching resist was formed on the layer. Then, a wiring drawn mask was placed, and then, exposure/developing was carried out. In this manner, a through hole (including a land) and an electric conductor circuit was formed of the resist. Then, etching was applied to a resist-free portion by using a sulfate-based etching solution or the like, and then, an etching resist was released. In this manner, a through hole, a land of a through hole 72, and an electric conductor circuit 74 were formed (refer to FIG. 5 (D)).

6. Embedding Through Hole

Figure 5:
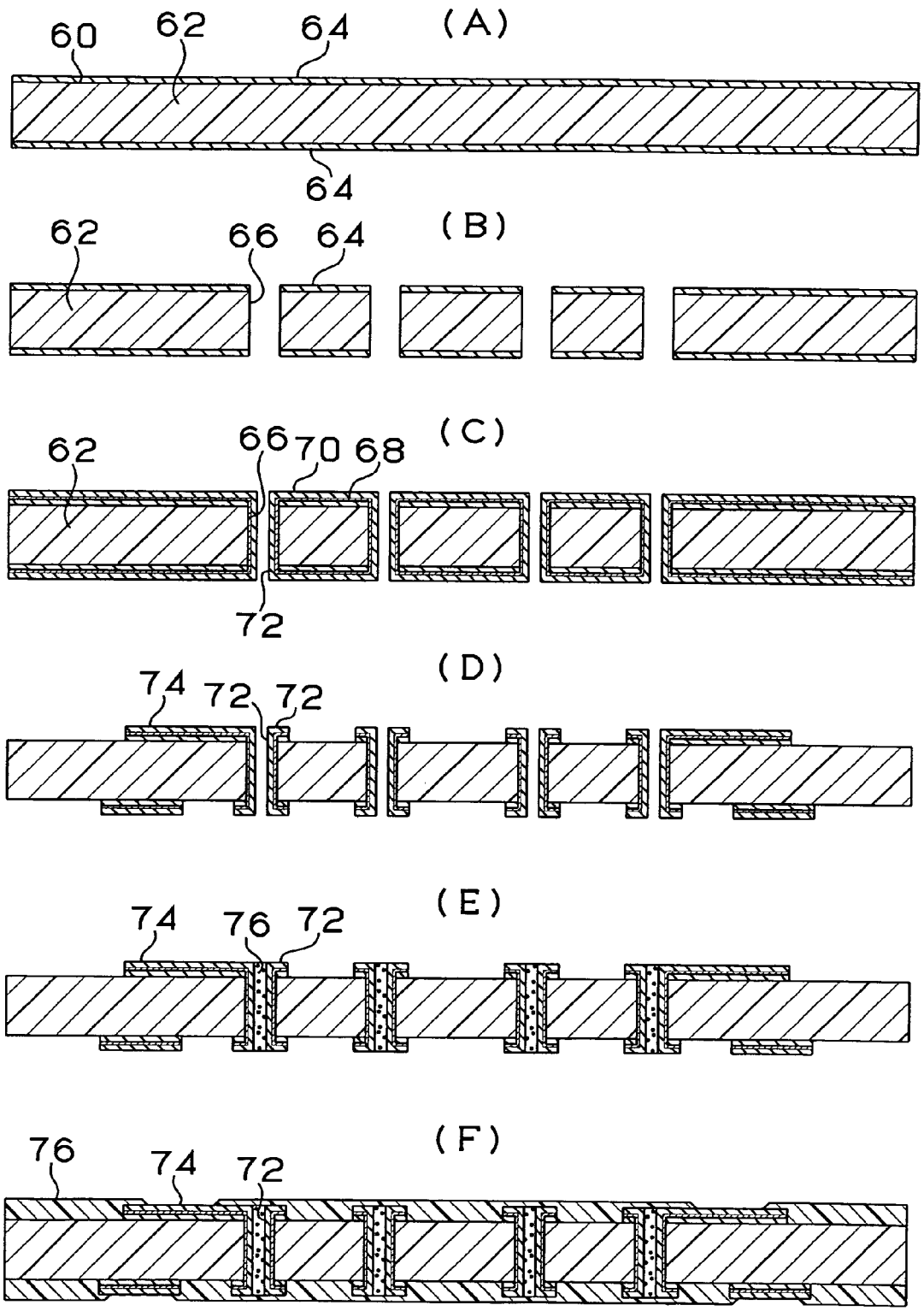
FIG. 5 is an illustrative view illustrating the steps of manufacturing a printed wiring board.

Using a thermosetting resin or a photo-setting resin as an embedding resin 76, the embedding of a through hole 72 was carried out in accordance with printing (refer to FIG. 5 (E)). At this time, this embedding may be carried out using a mask having a through hole portion drilled thereon. An embedding resin is excessively formed with respect to the through hole; and semi-hardening or hardening was carried out. Then, grinding was carried out, and a board surface was smoothened. In this manner, the through hole was embedded, and the smoothened board was obtained.

7. Forming Solder Resist Layer

A terminal serving as a portion for carrying out an electrical conductivity test was drilled on both sides of a board 60, and a solder resist 76 was formed (FIG. 5 (F)).

First Example 2

First Example 2 and First Reference Example 2 were substantially identical to First Example 1, whereas drills used for drill processing were as shown in Table 2.

TABLE 2

List of items of First Example 2 and First Reference Example 2

| Item | Torsion angle | Distal end angle of blade portion | Second release angle | Distal end outer diameter | Type |
|---|---|---|---|---|---|
| First Example 2-1 | 35 | 110 | 40 degree | 100 μm | Straight |
| First Example 2-2 | | 120 | 40 degree | 100 μm | Straight |
| First Example 2-3 | | 130 | 40 degree | 100 μm | Straight |
| First Example 2-4 | | 140 | 40 degree | 100 μm | Straight |
| First Example 2-5 | | 150 | 40 degree | 100 μm | Straight |
| First Reference Example 2-1 | | 90 | 40 degree | 100 μm | Straight |
| First Reference Example 2-2 | | 100 | 40 degree | 100 μm | Straight |
| First Reference Example 2-3 | | 160 | 40 degree | 100 μm | Straight |
| First Reference Example 2-4 | | 170 | 40 degree | 100 μm | Straight |

First Example 3

First Example 3 and First Reference Example 3 were substantially identical to First Example 1, whereas drills used for drill processing were as shown in Table 3.

TABLE 3

List of items of First Example 3 and First Reference Example 3

| Item | Torsion angle | Distal end angle of blade portion | Second release angle | Distal end outer diameter | Type |
|---|---|---|---|---|---|
| First Example 3-1 | 40 | 110 | 40 degree | 100 μm | Straight |
| First Example 3-2 | | 120 | 40 degree | 100 μm | Straight |
| First Example 3-3 | | 130 | 40 degree | 100 μm | Straight |
| First Example 3-4 | | 140 | 40 degree | 100 μm | Straight |
| First Example 3-5 | | 150 | 40 degree | 100 μm | Straight |
| First Reference Example 3-1 | | 90 | 40 degree | 100 μm | Straight |
| First Reference Example 3-2 | | 100 | 40 degree | 100 μm | Straight |
| First Reference Example 3-3 | | 160 | 40 degree | 100 μm | Straight |
| First Reference Example 3-4 | | 170 | 40 degree | 100 μm | Straight |

First Example 4

First Example 4 and First Reference Example 4 were substantially identical to First Example 1, whereas drills used for drill processing were as shown in Table 4.

TABLE 4

List of items of First Example 4 and First Reference Example 4

| Item | Torsion angle | Distal end angle of blade portion | Second release angle | Distal end outer diameter | Type |
|---|---|---|---|---|---|
| First Example 4-1 | 45 | 110 | 40 degree | 100 μm | Straight |
| First Example 4-2 | | 120 | 40 degree | 100 μm | Straight |
| First Example 4-3 | | 130 | 40 degree | 100 μm | Straight |
| First Example 4-4 | | 140 | 40 degree | 100 μm | Straight |
| First Example 4-5 | | 150 | 40 degree | 100 μm | Straight |
| First Reference Example 4-1 | | 90 | 40 degree | 100 μm | Straight |
| First Reference Example 4-2 | | 100 | 40 degree | 100 μm | Straight |
| First Reference Example 4-3 | | 160 | 40 degree | 100 μm | Straight |
| First Reference Example 4-4 | | 170 | 40 degree | 100 μm | Straight |

First Example 5

First Example 5 and First Reference Example 5 were substantially identical to First Example 1, whereas drills used for drill processing were as shown in Table 5.

TABLE 5

List of items of First Example 5 and First Reference Example 5

| Item | Torsion angle | Distal end angle of blade portion | Second release angle | Distal end outer diameter | Type |
|---|---|---|---|---|---|
| First Example 5-1 | 50 | 110 | 40 degree | 100 μm | Straight |
| First Example 5-2 |  | 120 | 40 degree | 100 μm | Straight |
| First Example 5-3 |  | 130 | 40 degree | 100 μm | Straight |
| First Example 5-4 |  | 140 | 40 degree | 100 μm | Straight |
| First Example 5-5 |  | 150 | 40 degree | 100 μm | Straight |
| First Reference Example 5-1 |  | 90 | 40 degree | 100 μm | Straight |
| First Reference Example 5-2 |  | 100 | 40 degree | 100 μm | Straight |
| First Reference Example 5-3 |  | 160 | 40 degree | 100 μm | Straight |
| First Reference Example 5-4 |  | 170 | 40 degree | 100 μm | Straight |

First Example 6

First Example 6 and First Reference Example 6 were substantially identical to First Example 1, whereas drills used for drill processing were of undercut type with a neck 42 shown in FIG. 4 (B), and also shown in Table 6.

TABLE 6

List of items of First Example 6 and First Reference Example 6

| Item | Torsion angle | Distal end angle of blade portion | Second release angle | Distal end outer diameter | Type |
|---|---|---|---|---|---|
| First Example 6-1 | 40 | 110 | 40 degree | 100 μm | Undercut |
| First Example 6-2 |  | 120 | 40 degree | 100 μm | Undercut |
| First Example 6-3 |  | 130 | 40 degree | 100 μm | Undercut |
| First Example 6-4 |  | 140 | 40 degree | 100 μm | Undercut |
| First Example 6-5 |  | 150 | 40 degree | 100 μm | Undercut |
| First Reference Example 6-1 |  | 90 | 40 degree | 100 μm | Undercut |
| First Reference Example 6-2 |  | 100 | 40 degree | 100 μm | Undercut |
| First Reference Example 6-3 |  | 160 | 40 degree | 100 μm | Undercut |
| First Reference Example 6-4 |  | 170 | 40 degree | 100 μm | Undercut |

First Example 7

First Example 7 and First Reference Example 7 were substantially identical to First Example 1, whereas drills used for drill processing were as shown in Table 7.

TABLE 7

List of items of First Example 7 and First Reference Example 7

| Item | Torsion angle | Distal end angle of blade portion | Second release angle | Distal end outer diameter | Type |
|---|---|---|---|---|---|
| First Example 7-1 | 40 | 120 | 30 degree | 100 μm | Straight |
| First Example 7-2 |  | 120 | 35 degree | 100 μm | Straight |
| First Example 7-3 |  | 120 | 40 degree | 100 μm | Straight |
| First Example 7-4 |  | 120 | 45 degree | 100 μm | Straight |
| First Example 7-5 |  | 120 | 50 degree | 100 μm | Straight |
| First Reference Example 7-1 |  | 120 | 20 degree | 100 μm | Straight |
| First Reference Example 7-2 |  | 120 | 25 degree | 100 μm | Straight |
| First Reference Example 7-3 |  | 120 | 55 degree | 100 μm | Straight |
| First Reference Example 7-4 |  | 120 | 60 degree | 100 μm | Straight |

First Example 8

First Example 8 and First Reference Example 8 were substantially identical to First Example 1, whereas a drill used for drill processing is of undercut type, and drilling was carried out as shown in Table 8.

TABLE 8

List of items of First Example 8 and First Reference Example 8

| Item | Torsion angle | Distal end angle of blade portion | Margin length | Distal end outer diameter | Type |
|---|---|---|---|---|---|
| First Example 8-1 | 40 | 120 | 0.1 mm | 100 μm | Undercut |
| First Example 8-2 | | 120 | 0.15 mm | 100 μm | Undercut |
| First Example 8-3 | | 120 | 0.2 mm | 100 μm | Undercut |
| First Example 8-4 | | 120 | 0.3 mm | 100 μm | Undercut |
| First Example 8-5 | | 120 | 0.4 mm | 100 μm | Undercut |
| First Example 8-6 | | 120 | 0.5 mm | 100 μm | Undercut |
| First Reference Example 8-1 | | 120 | 0.025 mm | 100 μm | Undercut |
| First Reference Example 8-2 | | 120 | 0.05 mm | 100 μm | Undercut |
| First Reference Example 8-3 | | 120 | 0.075 mm | 100 μm | Undercut |

First Example 9

First Example 9 and First Reference Example 9 were substantially identical to First Example 1, whereas drills used for drill processing had a distal end outer diameters as shown in Table 9.

In addition, in First Example 9, with respect to a drill whose distal end outer diameter is equal to or smaller than 100 microns, at the time of drill processing, a similar evaluation was carried out using 2 or 3 laminates of double-sided copper plated laminate boards.

TABLE 9

List of items of First Example 9 and First Reference Example 9

| Item | Torsion angle | Distal end angle of blade portion | Second release angle | Distal end outer diameter | Type |
|---|---|---|---|---|---|
| First Example 9-1 | 40 | 120 | 30 degree | 100 μm | Straight |
| First Example 9-2 | | 120 | 35 degree | 150 μm | Straight |
| First Example 9-3 | | 120 | 40 degree | 200 μm | Straight |
| First Example 9-4 | | 120 | 45 degree | 250 μm | Straight |
| First Example 9-5 | | 120 | 50 degree | 300 μm | Straight |
| First Example 9-6 | | 120 | 20 degree | 350 μm | Straight |
| First Example 9-7 | | 120 | 25 degree | 75 μm | Straight |
| First Example 9-8 | | 120 | 25 degree | 50 μm | Straight |
| First Reference Example 9-1 | | 120 | 55 degree | 400 μm | Straight |
| First Reference Example 9-2 | | 120 | 60 degree | 500 μm | Straight |

First Comparative Example

First Comparative Example was substantially identical to First Example 1, whereas drills used for drill processing were as shown in Table 10.

TABLE 10

List of items of First Comparative Example

| Item | Torsion angle | Distal end angle of blade portion | Distal end outer diameter | Type |
|---|---|---|---|---|
| First Comparative Example 1 | 50 | — | 100 μm | Straight Two-blade |
| First Comparative Example 2 | 50 | — | 200 μm | Straight Two-blade |
| First Comparative Example 3 | 25 | 100 | 100 μm | Straight |
| First Comparative Example 4 | | 110 | 100 μm | Straight |
| First Comparative Example 5 | | 120 | 100 μm | Straight |
| First Comparative Example 6 | 55 | 100 | 100 μm | Straight |
| First Comparative Example 7 | | 110 | 100 μm | Straight |
| First Comparative Example 8 | | 120 | 100 μm | Straight |

<Evaluation Items>
(1) Precision of Hole Position

Evaluations were carried out with respect to positions of through holes formed in 3000 shots and 6000 shots. Namely, positional shift distances of center points of through holes being formed at center portion with a land was compared.
O: Within positional shift range of 35 microns
Δ: Within positional shift range of 50 microns X: In excess of positional shift range of 50 microns
(2) Cross Section of Through Hole Cross cutting of a cross section of a through hole in 3000 shots and 6000 shots was carried out, and then, it was checked whether or not irregularities on a side face of an electric conductor layer existed.

O: Maximum degree of irregularity of opening is within 8 microns.

Δ: Maximum degree of irregularity of opening is within 10 microns.

X: Maximum degree of irregularity of opening is in excess of 10 microns.

(3) Measuring Electric Conductivity of Through Hole

It was checked whether or not there exists electric conductivity on both sides of a through hole in 3000 shots and 6000 shots.

O: Electrically conductive

X: Not electrically conductive (4) Reliability Test

While a heat cycle test (125° C. per 3 minutes <=> -65° C. per 3 minutes) was defined as one cycle, the test was repeated until the number of cycles in which a conductivity failure was confirmed. Then, a reliability evaluation was carried out using an electrical conductivity test such as a disconnection test. The maximum number of cycles was 3000. The an electric conductivity test was carried out every 1500 cycles, 2000 cycles, and 3000 cycles.

With respect to a case in which 2500 cycles were cleared, no problem occurred in actual use.

(5) Drill Breakage Evaluation

With respect to First Example 9 and First Comparative Example 9, the presence or absence of drill breakages in 1000 shots, 3000 shots, and 6000 shots (O: No breakage X: Breakage occurs) was evaluated. In addition, with respect to a case in which a distal end outer diameter of a drill in First Example 9 is equal to or smaller than 100 microns, a similar evaluation was carried out with respect to a case in which the number of laminates was 3 or 2.

FIG. 7 is a chart showing an evaluation result of each of First Example 1 and First Reference Example 1; FIG. 8 is a chart showing an evaluation result of each of First Example 2 and First Reference Example 2; FIG. 9 is a chart showing an evaluation result of each of First Example 3 and First Reference Example 3; FIG. 10 is a chart showing an evaluation result of each of First Example 4 and First Reference Example 4; FIG. 11 is a chart showing an evaluation result of each of First Example 5 and First Reference Example 5; FIG. 12 is a chart showing an evaluation result of each of First Example 6 and First Reference Example 6; FIG. 13 is a chart showing an evaluation result of each of First Example 7 and First Reference Example 7; FIG. 14 is a chart showing an evaluation result of each of First Example 8 and First Reference Example 8; FIG. 15 is a chart showing an evaluation result of each of First Example 9 and First Reference Example 9; FIG. 16 is a chart showing a break result of each of First Example 9 and First Reference Example 9; and FIG. 17 is a chart showing an evaluation result of Comparative Example 1.

From the evaluation results described above, as long as a torsion angle of a shaving discharge groove of a drill is in the range of 30 degrees to 50 degrees, it is found that a positional shift of a through hole drilled is small in size. In addition, it was clarified that the number of usable shots can be extended and that the drilled hole hardly lowers the precision and shape.

In the case where the torsion angle is less then 30 degrees or in the case where the torsion angle exceeds 50 degrees, the electric connectivity and reliability may be lowered. In addition, it was found that a drill deteriorates with a small number of shots used.

It is further desirable that the torsion angle be in the range of 35 degrees to 45 degrees. In this range, it is possible to use a drill for an extended period of time, and the lowering of precision of the drilled hole does not occur.

It is desirable that a distal end angle of a distal end blade portion be in the range of 110 degrees to 150 degrees. In this range, a positional shift hardly occurs, and the drilled hole is also formed in a desired shape. In addition, even if the number of shots with a drill increases, electric connectivity and reliability of a through hole are hardly lowered.

If the distal end angle of the distal end blade portion is less than 110 degrees, the electrical characteristics and reliability are lowered. On the other hand, if the distal end angle of the distal end blade portion exceeds 150 degrees, the drilled hole is easily shifted from a desired position. Therefore, when a hole has been formed as a through hole, the electrical connection with other conductor layer is lowered. In addition, when a reliability test is carried out, deterioration starts at an earlier stage.

In particular, as long as the distal end angle of the distal end blade portion is in the range between 120 degrees to 140 degrees, it was found that a positional shift hardly occurs. In addition, in the case where a second release angle of the distal end blade portion was in the range from 30 degrees to 50 degrees, it was found that reliability was not lowered.

In the case where a distal end outer diameter of a drill is in the range between 100 microns to 350 microns, it is possible to say that no breakage occurs and a printed wiring board is not affected so much in use. The drill could be used without any limitation to the number of laminates in particular. In the case where the outer diameter is less than 100 microns, a frequency of an occurrence of breakage increased. However, it was successfully verified that the drill was usable even in a large number of shots by changing a processing condition such as a condition for a limited number of laminates.

Second Example

Second Example of the present invention will be described below with reference to the accompanying drawings.

(Drill)

First, with reference to FIG. 20, a description will be given with respect to the steps of manufacturing a drill according to Second Example 1.

1. Preparing Material for Drill

Metals for use in a drill according to the present invention consist mainly of tungsten carbide and alloys including iron, cobalt, and nickel or the like. A column 50 including these metals is prepared so as to be equal to or greater than a diameter of a shank of the drill (FIG. 20 (A)). In particular, it is more desirable to use a tungsten carbide serving as a hard metal.

2. Drill Processing

In the metal of the thus prepared column 50, grinding is carried out in order to form a body 40 of a drill (FIG. 20 (B)). Namely, grinding is carried out until a diameter of a desired body has been obtained. In general, a drill of a straight type is obtained. At this time, in the body, an undercut shaped drill may be obtained such that a recessed portion has been formed partly of the body, as preferred.

In this manner, a shank 12 and the body 40 of the drill are configured.

Next, a shaving discharge grove 20 is formed in the body 40 of the drill (FIG. 20 (C)). The groove is formed in one stripe.

At this time, a torsion angle of a crossing point between the groove 20 and the body 40 is set at a desired angle. At this time, it is desirable that the angle be set in the range of 30 degrees to 50 degrees.

At this time, the gap between grooves 20 may be uniform or the groove gap may be gradually changed. In addition, the drill may be of type such that the depth of the groove sequentially shallows toward the body direction of the drill or may be equal in depth. In the present embodiment, the drill, hat the depth of the groove sequentially shallows, was processed and produced. This can be properly determined depending on a drilling diameter or a drilling material and the like.

Next, a blade portion 30 that is a distal end part of the drill is processed (FIG. 20 (D)). With respect to the processing sequences, although not limited in particular, the first angle and the second release angle forming the blade portion are processed, and then, each of the groove portions is ground and processed. Then, a portion called a respective release angle is processed in a planar shape or in a conical shape and the like. In this manner, a one-stripe groove consisting of the blade portion 30, the body 40, and the shank 12, the groove being adapted to discharge shavings, is formed in the body, whereby a one-blade drill can be obtained.

Figure 19:
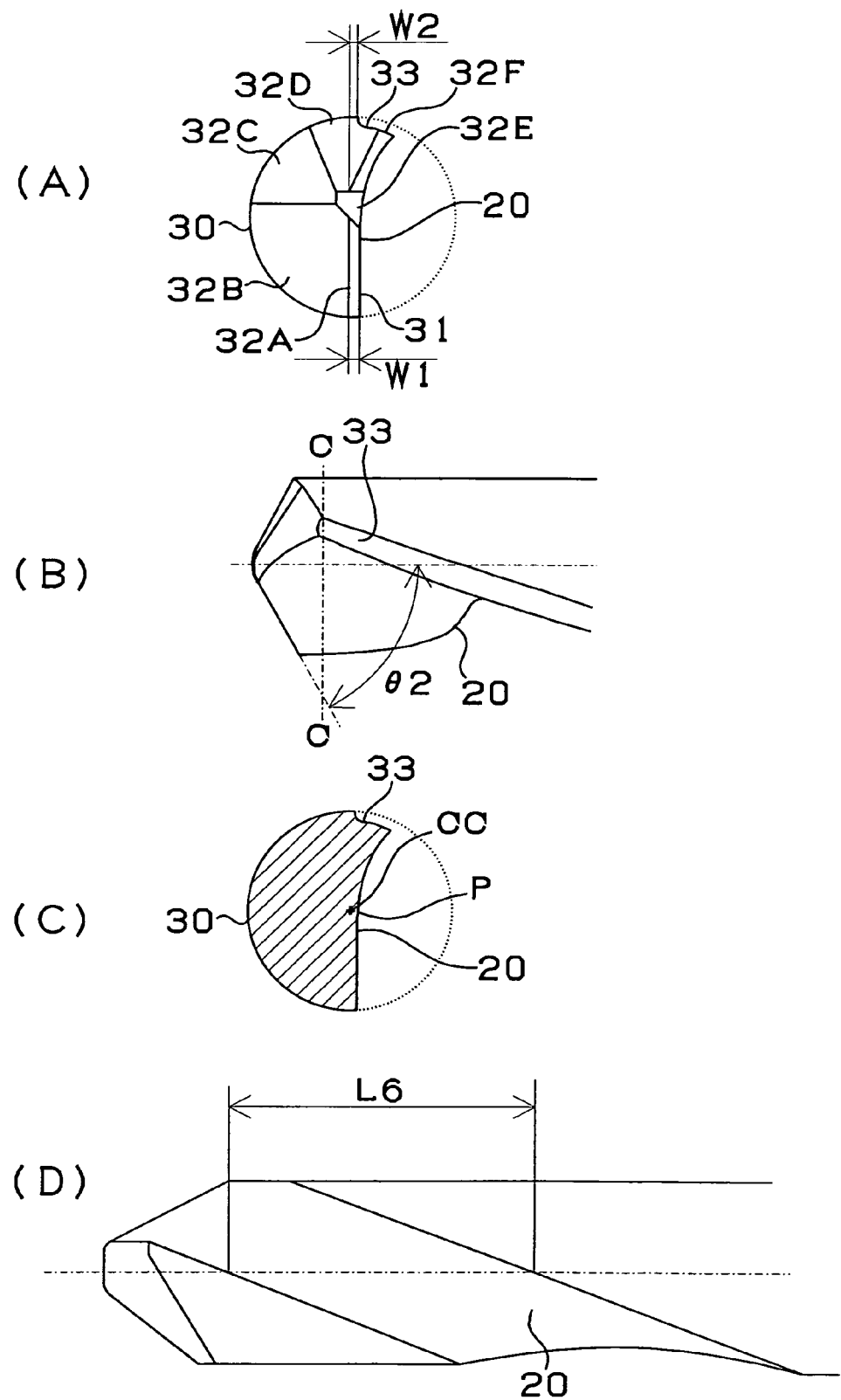
FIG. 19 (A) is a front view when a distal end side of the drill is seen.
Figure 35:
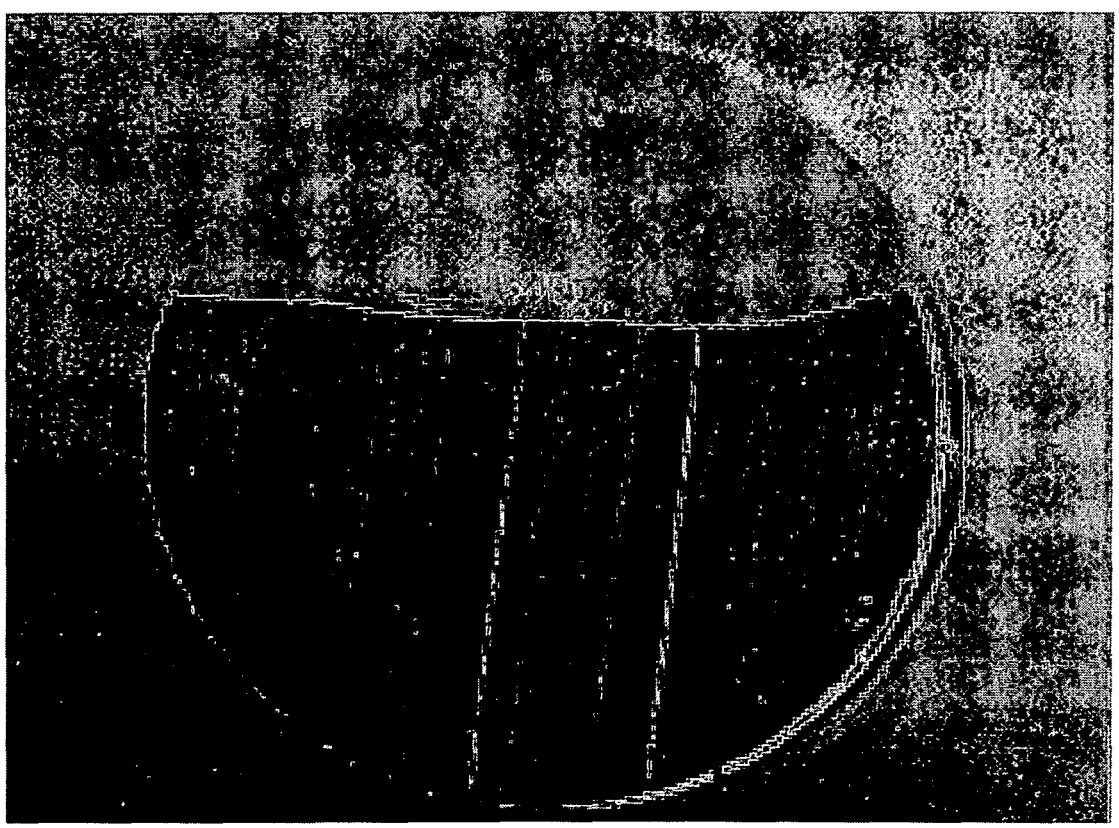
FIG. 35 is a photograph showing a sectional view of a drill according to Second Example 1.
Figure 36:
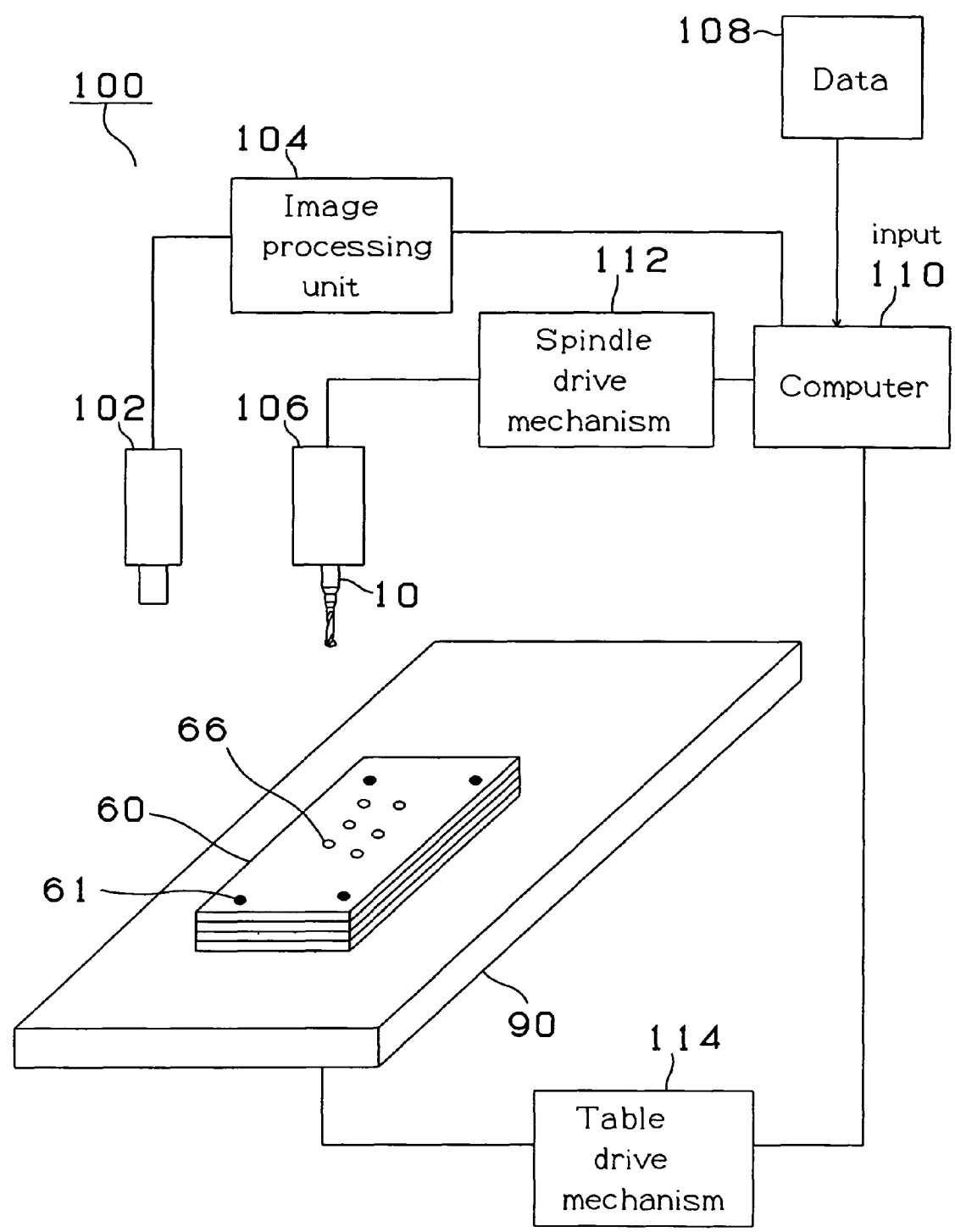
FIG. 36 is a block diagram depicting a drilling processing device of a printed wiring board according to the present invention.

FIG. 18 (A) is a side view showing a drill 10. FIG. 19 (A) is a front view when a distal end side of the drill is seen; FIG. 19(B) is an enlarged view showing a distal end part of the drill; FIG. 19(C) is a sectional view taken along the line C-C in FIG. 19(B); and FIG. 19 (D) is an enlarged view showing a distal end part of the drill. FIG. 35 is a photograph showing a cross section of the drill. FIG. 18(C) is a side view showing a drill of an undercut type.

As shown in FIG. 18, the distal end diameter D1 of the blade portion 30 of a drill 10 is set to 0.115 mm and the diameter D2 of the shank 12 is set to 2 mm. A cutting blade length L1 is set to 1.8 mm; a body length L2 is set to 2.0 mm; and a full length L3 is set to 31.75 mm. On the other hand, a torsion angle θ1 of the shaving discharge groove 20 is set to 40 degrees. The groove width L6 shown in FIG. 19 (D) is set to 0.145 mm. A distal end angle θ2 shown in FIG. 19 (B) is set to 150 degrees.

As shown in FIG. 19 (A), a distal end release face of the drill is formed in a multi-staged face shape composed of a plurality of flat release faces. A first release face 32A, a second release face 32B, a third release face 32C, and a fourth release face 32D that are flat faces are sequentially disposed along a peripheral direction from a cutting blade 31 toward a drill rotation direction (in the counterclockwise direction in the figure). In addition, an opposite side first release face 32E and an opposite side release face 32F that are flat faces are disposed in the vicinity of an axle. A second chamber face 33 formed in a sectional substantial arc shape is provide adjacent to the fourth release face 32D and the opposite side second release face 32F. A release angle of the first release face 32A is set to 10 degrees and a release angle of the second release face 32B is set to 40 degrees.

As shown in FIG. 19 (C), a cross section of a proximal part of a blade tip was 69.77% in metal occupying rate. In addition, a curvature radius in an axially vertical direction at the deepest part P (a site that is the closest to an axle) of a proximal end of the formed groove 20 was 2.95 mm.

(Drill Processing Method of Printed Wiring Board)

1. Copper Plated Laminate Board

An insulation substrate opened by the drill according to the present invention can be used as long as it is obtained as an organic insulation substrate. Specifically, it is desirable that such insulation substrate be a rigid (hard) laminate substrate selected from an alamide non-woven cloth-epoxy resin substrate; a glass cloth epoxy resin substrate; an alamide non-woven cloth-polyimide substrate; a glass cloth bis maleimide triadine resin substrate; a glass cloth polyphenylene ether resin substrate, FR-4, and FR-5, or alternatively, a flexible substrate made of a polyethylene ether (PPE) film or polyimide (PI) film.

The thickness of the above insulation resin substrate is in the range of 10 microns to 800 microns, is preferably in the range of 20 microns to 400 microns, and is optimally in the range of 50 microns to 300 microns. This is because, if the thickness becomes smaller than these ranges, the rigidity is lowered, and the substrate is difficult to handle; and conversely, if the thickness is too large, a small diameter through hole and an electric conductor layer are difficult to be formed.

The thickness of a copper foil of an insulation substrate is in the range of 5 microns to 50 microns, is preferably in the range of 8 microns to 30 microns, and is further preferably in the range of 12 microns to 25 microns. This is because, when a small diameter through hole is provided in accordance with drill processing, if the thickness is too small, the pattern is precluded from being formed, and conversely, if the thickness is too large, a fine pattern is hardly formed in accordance with etching.

A one-sided or double-sided cupper plated laminate board of these substrates is prepared and used.

2. Processing Condition

Processing condition is the same as described in First Example.

At this time, it is desirable to use a drill processing condition below.

Rotation frequency: 100 Krpm to 500 Krpm

Feed speed: 30 inches per minute to 200 inches per minute

Number of shots: It is desirable to use as much as 3000 shots or more.

Here, if the rotation frequency is less than 100 Krpm, processing cannot be efficiently carried out. On the other hand, if the rotation frequency exceeds 500 Krpm, it increases the probability that a service life is reduced by drill heating.

If the feed speed is less than 30 inches per minute, processing cannot be efficiently carried out. On the other hand, the feed speed exceeds 200 inches per minute, a drill burden increases, and breakage easily occurs. In particular, it is desirable that the rotation frequency be in the range of 200 Krpm to 400 Krpm and the feed speed be in the range of 40 inches per minute to 120 inches per minute. This condition is more desirable from the viewpoint of processing efficiency of a through hole and a service life of the drill. In addition, a failure in forming the through hole is also a processing condition that most hardly occurs.

On a drilled cupper plated laminate board, a through hole and a board having formed thereon a land and an electric conductor circuit of the through hole are formed in accordance with a subtractive process or a tenting.

Further, a board may be laminated in accordance with a press technique in order to form a multi-layered board or multi-layering may be carried out in accordance with an additive process while the board having the through hole formed thereon is used as a core board.

Second Example 1

1. Preparing Material for Drill

A metal formed with an alloy consisting mainly of tungsten carbide and also metals such as cobalt was prepared. The prepared metal was adjusted to a diameter of a processing device for thickening the metal to be larger than a drill diameter to be circularly formed and for rotating a drill.

2. Drill Processing

First, a portion forming a body of a drill is processed. In this manner, a shank and a body part of the drill are formed. At this time, a diameter of the body is adjusted to a preset diameter. In this case, the drill diameter is set so as to be 100+/−10 microns.

Then, a groove is formed in a one-stripe shape so as to discharge shavings. At this time, a torsion angle of the drill is set so as to be a preset angle. In this Second Example, the torsion angle is set to 40 degrees. Then, in order to form one blade, a first angle and a second release angle are formed, and then, the steps of forming a respective release angle are carried out. At this time, with respect to a metal occupying rate in a proximal end of a blade tip of the body and a curvature radius of the thus formed groove, drill processing was carried out under a condition as shown in Table 11.

Table of Items of Second Example and Second Reference Example

TABLE 11

| Item | Metal occupying rate | Curvature radius of groove | Drill diameter | Type |
|---|---|---|---|---|
| Second Example 1-1 | 69.8 | 2.95 | 100 μm | Straight |
| Second Example 1-2 | 69.8 | 1.50 | 100 μm | Straight |
| Second Example 1-3 | 69.8 | 3.50 | 100 μm | Straight |
| Second Reference Example 1-1 | 69.8 | 1.40 | 100 μm | Straight |
| Second Reference Example 1-2 | 69.8 | 3.60 | 100 μm | Straight |

3. Drilling Processing of Drill

Drill Processing

As in First Example described above with reference to FIG. 5 (A), four double-sided copper plated laminate boards 60 (material: glass epoxy resin or polyimide resin; 200 microns in thickness of insulation layer 62; and 12 microns in thickness of copper foil 64 on one side) were laminated on an X-Y table 90 for drill processing of a drill processing device (available from Hitachi Via Co., Ltd. Model: ND-N series) as shown in FIG. 6. A disposal board (backup board) 92 was placed at the lower side of the double-sided copper plated laminate board. An entry sheet 94 for drill processing was placed.

In that state, the drilling of a drilling diameter of 100 microns was carried out in the drill condition shown below. At this time, every time the four laminate boards were processed, the number of drilling shots was converted as one shot.

<Drill Processing Condition>

Rotation frequency: 300 Krpm
Feed speed: 40 inches per minute
Shape of use drill: Drill shown in Table 11
Number of evaluation shots: 1500 shots, 3000 shots, 4500 shots, and 6000 shots In this manner, a through hole 66 having a drilling diameter of 100 microns was provided in the board 60 (FIG. 5 (B)).

After drill processing, a desmear processing was applied to the double-sided copper plated laminate board for 5 minutes by means of a per manganese acid.

4. Forming Electric Conductor in Through Hole

An electroless plating film 66 and an electrolytic plating film 68 were sequentially provided, and then, an electric conductor layer was formed on an internal wall of a through hole 66 and a top layer of a laminate board (FIG. 5 (C)). At this time, plating was carried out under the plating condition similar to that in First Example.

5. Forming Circuit

A through hole 72, a land of a through hole 72, and an electric conductor circuit 74 were formed in the same manner as in First Example (FIG. 5 (D)).

6. Embedding Through Hole

Using a thermosetting resin or a photo-setting resin as an embedding resin 76, the embedding of a through hole 72 was carried out in accordance with printing in the same manner as in First Example (FIG. 5 (E)).

7. Forming Solder Resist Layer

A terminal serving as a portion for carrying out an electrical conductivity test was drilled on both sides of a board 60, and a solder resist 76 was formed (FIG. 5 (F)).

Second Example 2

Table 12 shows a list of items in Second Example 2. In Second Example 2, a metal occupying rate was set to 40%, that is a lower limit.

TABLE 12

| Item | Metal occupying rate | Curvature radius of groove | Drill diameter | Type |
|---|---|---|---|---|
| Second Example 2-1 | 40 | 2.95 | 100 μm | Straight |
| Second Example 2-2 | 40 | 1.50 | 100 μm | Straight |
| Second Example 2-3 | 40 | 3.50 | 100 μm | Straight |
| Second Reference Example 2-1 | 40 | 1.40 | 100 μm | Straight |
| Second Reference Example 2-2 | 40 | 3.60 | 100 μm | Straight |

Second Example 3

Table 13 shows a list of items of Second Example 53. In Second Example 3, a metal occupying rate was set to 80%, that is an upper limit.

TABLE 13

| Item | Metal occupying rate | Curvature radius of groove | Drill diameter | Type |
|---|---|---|---|---|
| Second Example 3-1 | 80 | 2.95 | 100 μm | Straight |
| Second Example 3-2 | 80 | 1.50 | 100 μm | Straight |
| Second Example 3-3 | 80 | 3.50 | 100 μm | Straight |
| Second Reference Example 3-1 | 80 | 1.40 | 100 μm | Straight |
| Second Reference Example 3-2 | 80 | 3.60 | 100 μm | Straight |

Second Modified Example 1

Table 14 shows a list of items of Second Modified Example 1. Second Modified Example 1 was different from Second Example 1 in the drill diameter, whereas a metal occupying rate was set to 80%, that is an upper limit.

TABLE 14

| Item | Metal occupying rate | Curvature radius of groove | Drill diameter | Type |
|---|---|---|---|---|
| Second Modified Example 1-1 | 80 | 1.50 | 150 μm | Straight |
| Second Modified Example 1-2 | 80 | 1.50 | 250 μm | Straight |
| Second Modified Example 1-3 | 80 | 1.50 | 300 μm | Straight |
| Second Modified Example 1-4 | 80 | 1.50 | 350 μm | Straight |
| Second Modified Example 1-5 | 80 | 3.50 | 100 μm | Straight |
| Second Modified Example 1-6 | 80 | 3.50 | 250 μm | Straight |
| Second Modified Example 1-7 | 80 | 3.50 | 300 μm | Straight |
| Second Modified Example 1-8 | 80 | 3.50 | 350 μm | Straight |

Second Modified Example 2

Table 15 shows a list of items of Second Modified Example 2. Second Modified Example 2 was different from Second Example 1 in the drill diameter, whereas a metal occupying rate was set to 40%, that is a lower limit.

TABLE 15

| Item | Metal occupying rate | Curvature radius of groove | Drill diameter | Type |
|---|---|---|---|---|
| Second Modified Example 2-1 | 40 | 1.50 | 150 μm | Straight |
| Second Modified Example 2-2 | 40 | 1.50 | 250 μm | Straight |
| Second Modified Example 2-3 | 40 | 1.50 | 300 μm | Straight |
| Second Modified Example 2-4 | 40 | 1.50 | 350 μm | Straight |
| Second Modified Example 2-5 | 40 | 3.50 | 100 μm | Straight |
| Second Modified Example 2-6 | 40 | 3.50 | 250 μm | Straight |
| Second Modified Example 2-7 | 40 | 3.50 | 300 μm | Straight |
| Second Modified Example 2-8 | 40 | 3.50 | 350 μm | Straight |

Second Modified Example 3

Table 16 shows a list of items of Second Modified Example 3. Second Modified Example 3 was different from Second Example 1 in the drill diameter, whereas a metal occupying rate was set to 80%, that is an upper limit.

TABLE 16

| Item | Metal occupying rate | Curvature radius of groove | Drill diameter | Type |
|---|---|---|---|---|
| Second Modified Example 3-1 | 80 | 1.50 | 150 μm | Straight |
| Second Modified Example 3-2 | 80 | 1.50 | 250 μm | Straight |
| Second Modified Example 3-3 | 80 | 1.50 | 300 μm | Straight |
| Second Modified Example 3-4 | 80 | 1.50 | 350 μm | Straight |
| Second Modified Example 3-5 | 80 | 3.50 | 100 μm | Straight |
| Second Modified Example 3-6 | 80 | 3.50 | 250 μm | Straight |
| Second Modified Example 3-7 | 80 | 3.50 | 300 μm | Straight |
| Second Modified Example 3-8 | 80 | 3.50 | 350 μm | Straight |

Second Modified Example 4

Table 17 shows a list of items of Second Modified Example 4. Second Modified Example 4 was similar to Second Modified Example 2, whereas drills of an undercut type were used as a drill.

TABLE 17

| Item | Metal occupying rate | Curvature radius of groove | Drill diameter | Type |
|---|---|---|---|---|
| Second Modified Example 4-1 | 40 | 1.50 | 150 μm | Undercut |
| Second Modified Example 4-2 | 40 | 1.50 | 250 μm | Undercut |
| Second Modified Example 4-3 | 40 | 1.50 | 300 μm | Undercut |
| Second Modified Example 4-4 | 40 | 1.50 | 350 μm | Undercut |
| Second Modified Example 4-5 | 40 | 3.50 | 100 μm | Undercut |
| Second Modified Example 4-6 | 40 | 3.50 | 250 μm | Undercut |
| Second Modified Example 4-7 | 40 | 3.50 | 300 μm | Undercut |
| Second Modified Example 4-8 | 40 | 3.50 | 350 μm | Undercut |

Second Modified Example 5

Table 18 shows a list of items of Second Modified Example 5. Second Modified Example 5 was similar to Second Example 3, whereas a drill of an undercut type was used as a drill.

TABLE 18

| Item | Metal occupying rate | Curvature radius of groove | Drill diameter | Type |
|---|---|---|---|---|
| Second Modified Example 5-1 | 80 | 1.50 | 150 μm | Undercut |
| Second Modified Example 5-2 | 80 | 1.50 | 250 μm | Undercut |
| Second Modified Example 5-3 | 80 | 1.50 | 300 μm | Undercut |
| Second Modified Example 5-4 | 80 | 1.50 | 350 μm | Undercut |
| Second Modified Example 5-5 | 80 | 3.50 | 100 μm | Undercut |
| Second Modified Example 5-6 | 80 | 3.50 | 250 μm | Undercut |
| Second Modified Example 5-7 | 80 | 3.50 | 300 μm | Undercut |
| Second Modified Example 5-8 | 80 | 3.50 | 350 μm | Undercut |

Second Comparative Example 1

Table 19 shows a list of items of Second Comparative Example 1. In Second Comparative Example 1, a metal occupying rate was set to 38.9%, and drills having a distal end diameter of 100 microns were used.

TABLE 19

| Item | Metal occupying rate | Curvature radius of groove | Drill diameter | Type |
|---|---|---|---|---|
| Second Comparative Example 1-1 | 38.9 | 1.34 | 100 μm | Straight |
| Second Comparative Example 1-2 | 38.9 | 1.49 | 100 μm | Straight |
| Second Comparative Example 1-3 | 38.9 | 2.23 | 100 μm | Straight |
| Second comparative Example 1-4 | 38.9 | 3.21 | 100 μm | Straight |
| Second Comparative Example 1-5 | 38.9 | 3.71 | 100 μm | Straight |

Second Comparative Example 2

Table 20 shows a list of items of Second Comparative Example 2. In Second Comparative Example 2, a metal occupying rate was set to 81.2%, and drills having a distal end diameter of 100 microns were used.

TABLE 20

| Item | Metal occupying rate | Curvature radius of groove | Drill diameter | Type |
|---|---|---|---|---|
| Second Comparative Example 2-1 | 81.2 | 1.34 | 100 μm | Straight |
| Second Comparative Example 2-2 | 81.2 | 1.49 | 100 μm | Straight |
| Second Comparative Example 2-3 | 81.2 | 2.23 | 100 μm | Straight |
| Second comparative Example 2-4 | 81.2 | 3.21 | 100 μm | Straight |
| Second Comparative Example 2-5 | 81.2 | 3.71 | 100 μm | Straight |

<Evaluation Items>
(1) Drill Damage Verification Test

In drills produced in Second Example, Second Reference Example, Second Modified Example, and Second Comparative Example, verification was carried out with respect to the number of shots when damage to drills was found. The results are shown in FIG. 32 to FIG. 34.

(2) Precision of Hole Position

Evaluations were carried out with respect to positions of through holes formed in 3000 shots and 6000 shots. Namely, a positional shift distance of the center points of the through holes being formed at a center portion with a land were compared.

A board positioned at the lowest part of the laminated boards was used for measurement. Length of the hole positions of 30 sites were arbitrarily measured. Evaluations were carried out in accordance with a ratio that exceeds the positional shift range of 50 microns.
O: Equal to or smaller than 3%
A: Equal to or smaller than 5%
X: Over 5%

(3) Cross Section of Through Hole

After desmear process in 3000 shots and 6000 shots in number, the crosscutting of a cross section of a through hole on a substrate was carried out, and the relevant cross section was observed. A board positioned at the lowest part of the laminated boards was used for measurement. A total of 5 sites were observed, and the presence or absence of smear residue was observed.
O: No smear
X: With smear residue (4) Electric Conductivity Measurement of Through Hole The presence or absence of electric conductivity at 3000 shots and 6000 shots in number was verified.
O: Electrically conductive
X: Not electrically conductive (5) Reliability Test A heat cycle test (125° C. per 3 minutes <=> −65° C. per 3 minutes) was repeatedly carried out until the number of cycles was reached such that an electric conductivity failure is found, and reliability evaluation was carried out through an electric conductivity test such as a disconnection test. A maximum number of cycles was 4000. An electric conductivity test was carried out every 1000 cycles such as 1000 cycles, 2000 cycles, 3000 cycles, and 4000 cycles.

With respect to a case in which 3000 cycles were cleared, no problem occurred in actual use.

FIG. 23 to FIG. 31 show evaluation results of Second Example, Second Reference Example, and Second Comparative Example. From the above evaluation results, as long as a metal occupying rate of a drill was in the range of 40% to 80%, and a curvature radius of a distal end portion of a groove in a body was in the range of 1.50 mm to 3.50 mm, it was found that the precision of the hole position is not lowered, and no problem such as smear residues occurs, and electric conductivity reliability is not lowered. In addition, it was clarified that the usable number of shots in a drill can be extended.

On the other hand, in the case where an occupying rate of a metal in cross section at a proximal end of a blade tip in a drill body was less than 40% or in excess of 80%, it was found that the drill is easily damaged, and the electric connectivity and reliability of the drilled through hole are lowered. On the other hand, in a drill featured in that a curvature radius in an axially vertical direction of the deepest portion of a groove is less than 1.50, a shape failure or a positional shift of a drilled through hole is likely to occur, and the electric connectivity and reliability is easily lowered. Similarly, in a drill featured in that a curvature radius exceeds 3.50 mm, it was found that a hole positional shift is easily induced and the electric connectivity and reliability is easily lowered.

INDUSTRIAL APPLICABILITY

While First Example and Second Example described above have shown an example of using a drill for drilling a copper plated laminate board for a printed wiring board, the drill according to the present application can be suitably used for drilling a laminate between a variety of resins and a metal.

The invention claimed is:

1. A drill for drilling piled copper plated laminate boards, comprising:
    a shank; and
    a body extending from an end portion of the shank, the body having a blade portion at a distal end of the body and a shaving discharge groove formed in the blade portion,
    wherein the shaving discharge groove of the body is formed in a one-stripe shape, the shaving discharge groove has a torsion angle which is in a range of 30 degrees to 50 degrees, the blade portion has a distal end angle which is in a range of 110 degrees to 150 degrees, the body has an occupying rate of a metal at a proximal end of a blade tip of the body in a range of 40% to 80%, and the groove has a curvature radius in an axially vertical direction of a deepest portion of the groove at the proximal end in a range of 1.50 mm to 3.50 mm.

2. The drill according to claim 1, wherein the distal end angle of the blade portion is in a range of 120 degrees to 140 degrees.

3. The drill according to claim 2, wherein the blade portion has a second release angle which is in a range of 30 degrees to 50 degrees.

4. The drill according to claim 3, wherein the blade portion has a distal end outer diameter which is equal to or smaller than 350 microns.

5. The drill according to claim 2, wherein the blade portion has a distal end outer diameter which is equal to or smaller than 350 microns.

6. The drill according to claim 1, wherein the blade portion has a second release angle which is in a range of 30 degrees to 50 degrees.

7. The drill according to claim 6, wherein the blade portion has a distal end outer diameter which is equal to or smaller than 350 microns.

8. The drill according to claim 1, wherein the blade portion has a distal end outer diameter which is equal to or smaller than 350 microns.

9. The drill according to claim 1, wherein the shank has a neck which is connected to the body, and the shaving discharge groove does not contact to the neck.

10. The drill according to claim 9, wherein a length obtained by subtracting a length of the neck from a length of the body is in a range of 0.1 mm to 0.3 mm.

11. A drill for forming an opening in a work piece, comprising:
    a shank; and
    a body extending from an end portion of the shank, the body having a blade portion at a distal end of the body and a groove formed in a one-stripe shape in the blade portion,
    wherein the body has an occupying rate of a metal at a proximal end of a blade tip of the body in a range of 40% to 80%, the groove has a curvature radius in an axially vertical direction of a deepest portion of the groove at the proximal end in a range of 1.50 mm to 3.50 mm, and the shank has a distal end diameter which is equal to or smaller than 300 microns.

12. The drill according to claim 11, wherein the distal end diameter of the shank is equal to or smaller than 150 microns.

* * * * *